United States Patent [19]
Sato et al.

[11] Patent Number: 5,474,612
[45] Date of Patent: Dec. 12, 1995

[54] VAPOR-PHASE DEPOSITION APPARATUS AND VAPOR-PHASE DEPOSITION METHOD

[75] Inventors: Yuusuke Sato; Toshimitsu Ohmine, both of Tokyo, Japan

[73] Assignee: Kabushiki Kaisha Toshiba, Kawasaki, Japan

[21] Appl. No.: 240,807

[22] Filed: May 11, 1994

Related U.S. Application Data

[63] Continuation of Ser. No. 672,120, Mar. 19, 1991, abandoned.

[30] Foreign Application Priority Data

Mar. 19, 1990 [JP] Japan ..................... 2-66935

[51] Int. Cl.⁶ ..................... C23C 16/00
[52] U.S. Cl. ..................... 118/725; 118/728
[58] Field of Search ..................... 118/725, 728

[56] References Cited

U.S. PATENT DOCUMENTS 4,535,227  8/1985  Shimizu ..................... 118/725

FOREIGN PATENT DOCUMENTS

| | | |
|---|---|---|
| 090321 | 10/1983 | European Pat. Off. . |
| 3741708 | 6/1989 | Germany . |
| 53-91076 | 8/1978 | Japan . |
| 58-7818 | 1/1983 | Japan . |
| 59-44819 | 3/1984 | Japan ..................... 118/725 |
| 61-215289 | 9/1986 | Japan . |
| 62-4315 | 1/1987 | Japan . |

*Primary Examiner*—Richard Bueker
*Attorney, Agent, or Firm*—Oblon, Spivak, McClelland, Maier & Neustadt

[57] ABSTRACT

A vapor-phase deposition apparatus comprises a substrate-supporting unit for supporting a substrate, a heater for heating the substrate-supporting unit, and a gas-supplying unit for supplying gas for forming a thin film on the substrate supported by the substrate-supporting unit. The substrate-supporting unit includes a first member to be heated to a predetermined temperature by the heater, a second member for supporting a peripheral part of the substrate, and a support member for supporting the second member on the first member and located outside a periphery of the substrate.

5 Claims, 18 Drawing Sheets

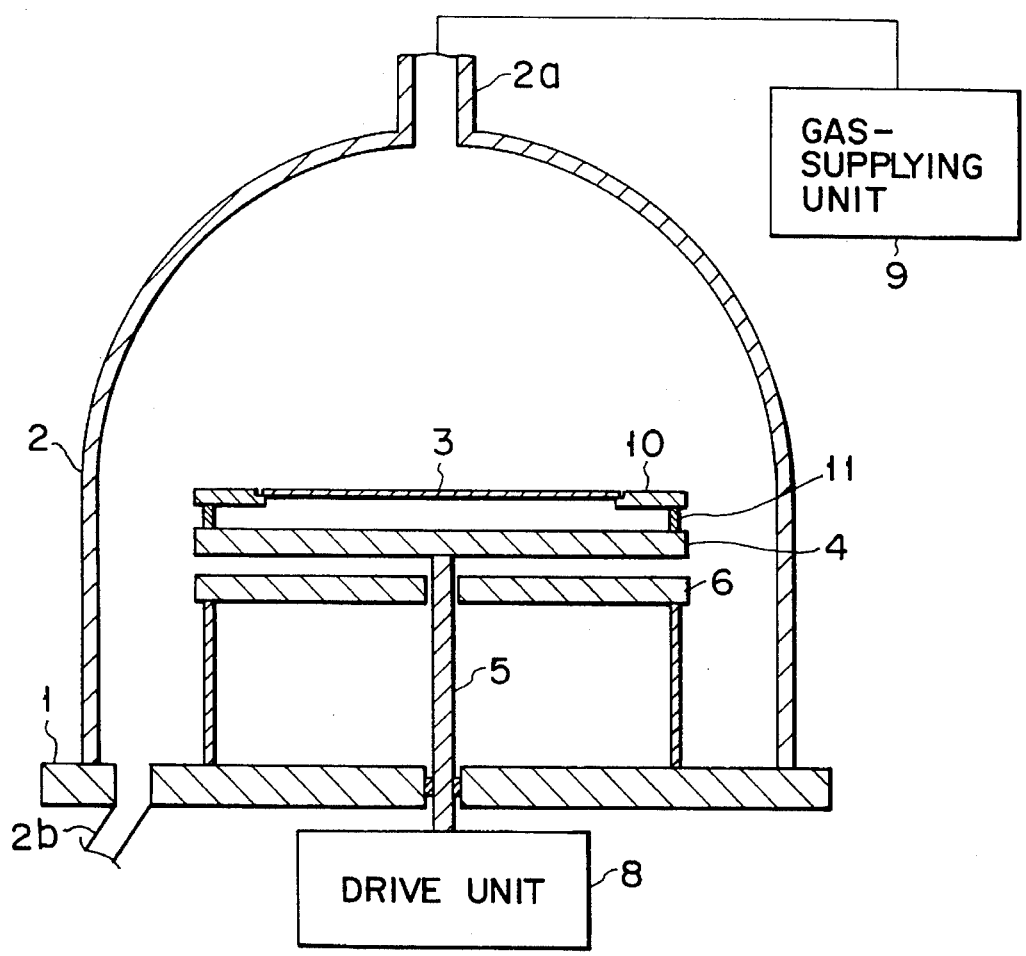
F I G. 1
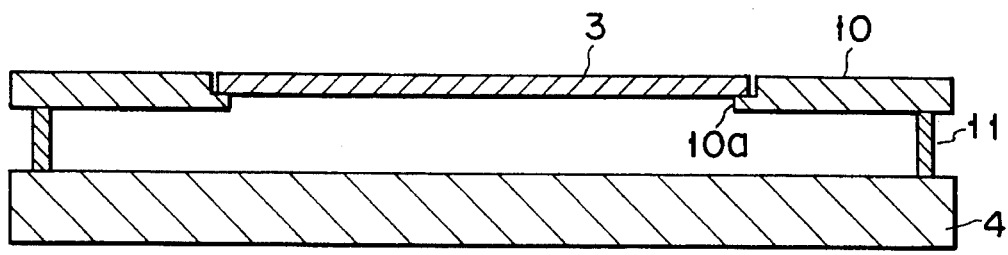
F I G. 2

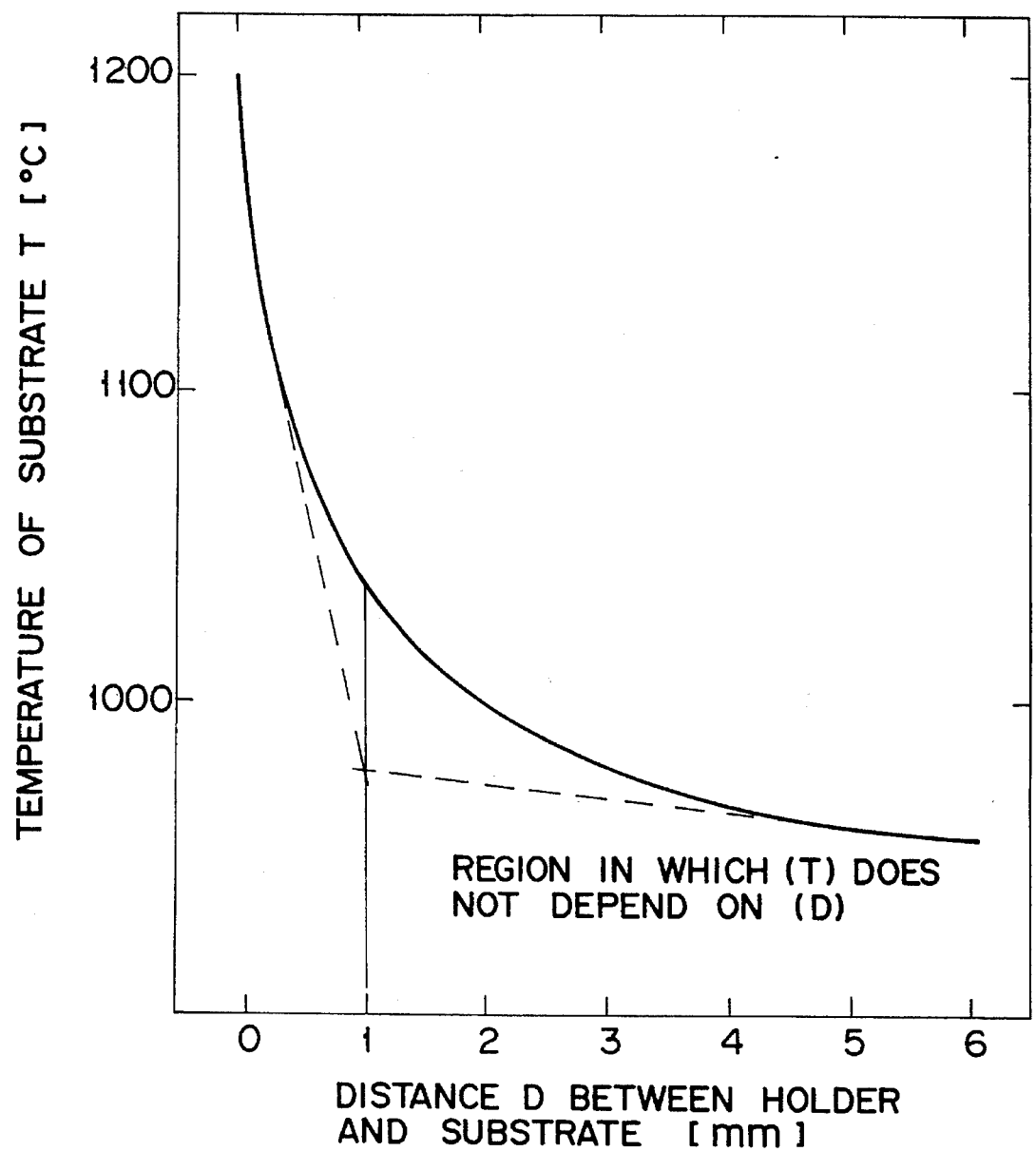
F I G. 3

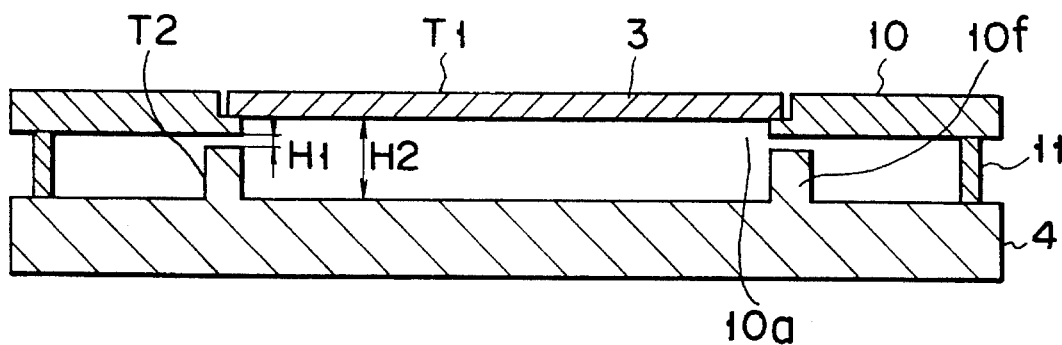
F I G. 18
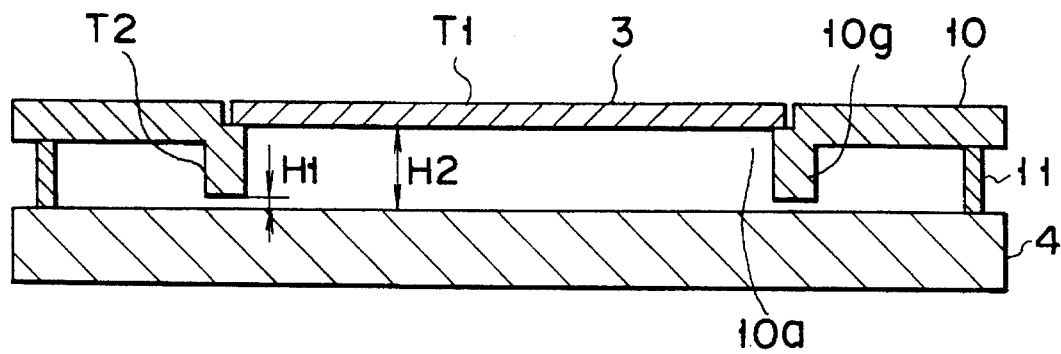
F I G. 19

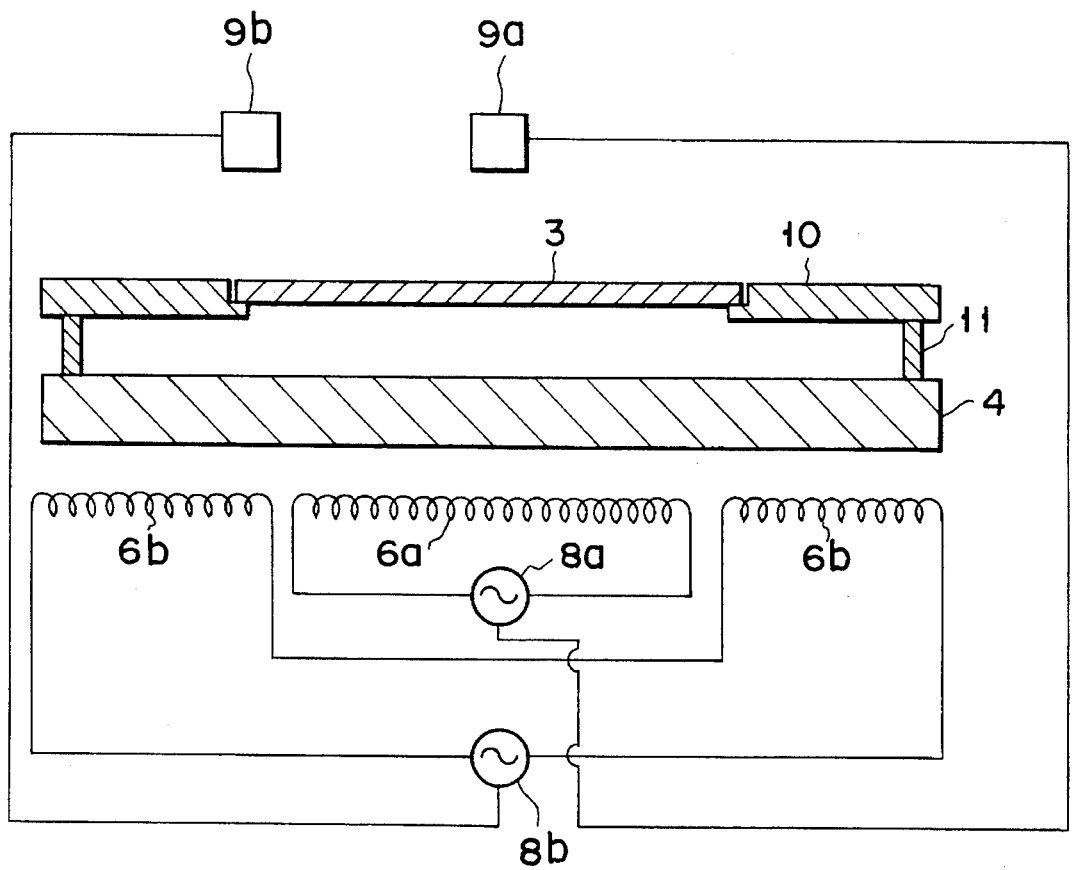
F I G. 21

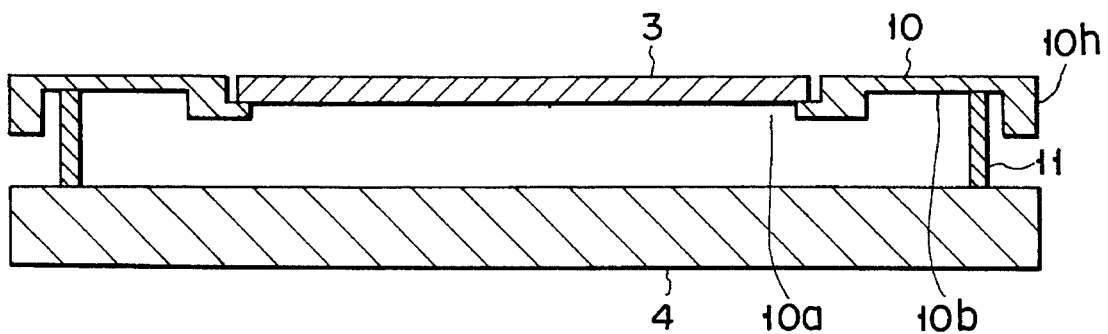
F I G. 23
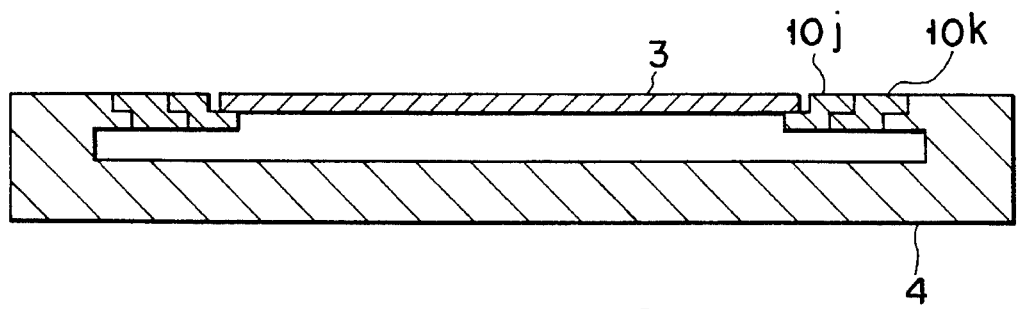
F I G. 24
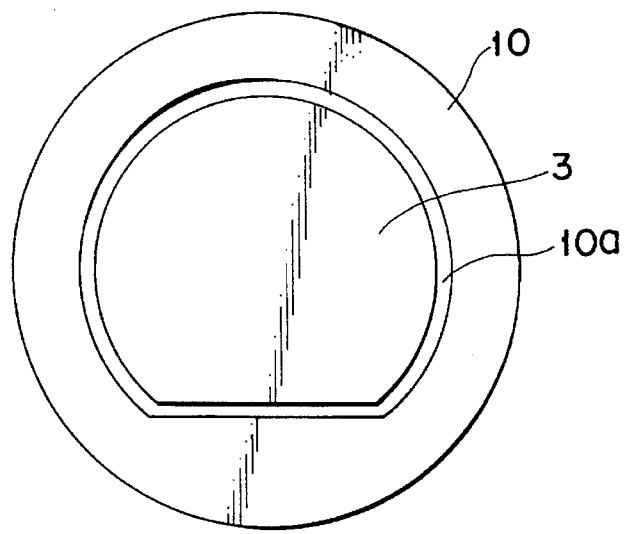
F I G. 25

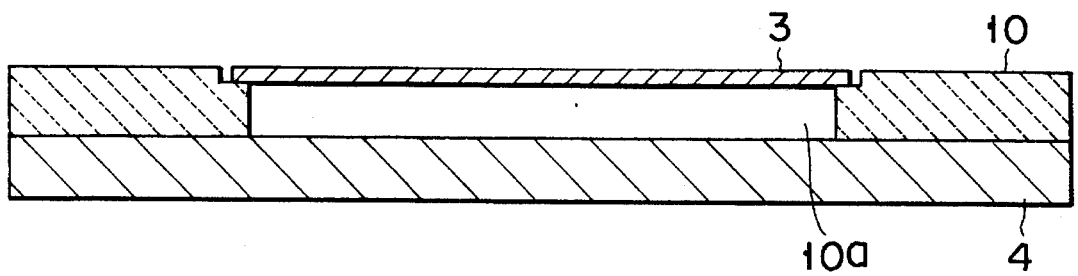
F I G. 26
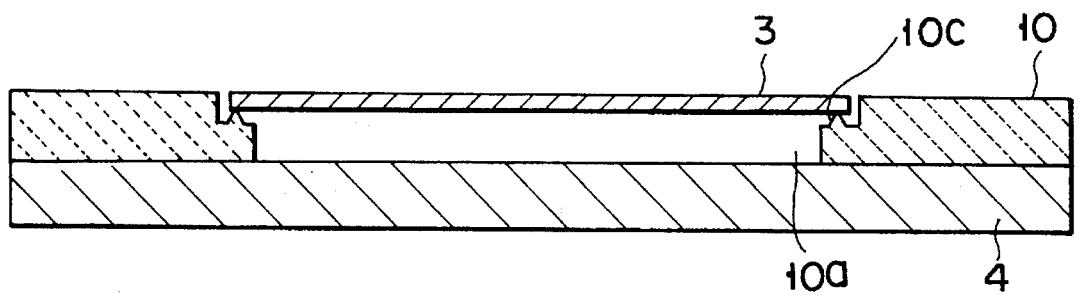
F I G. 27
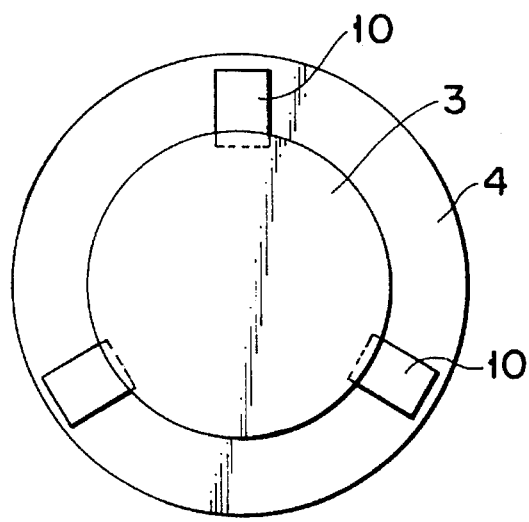
F I G. 28

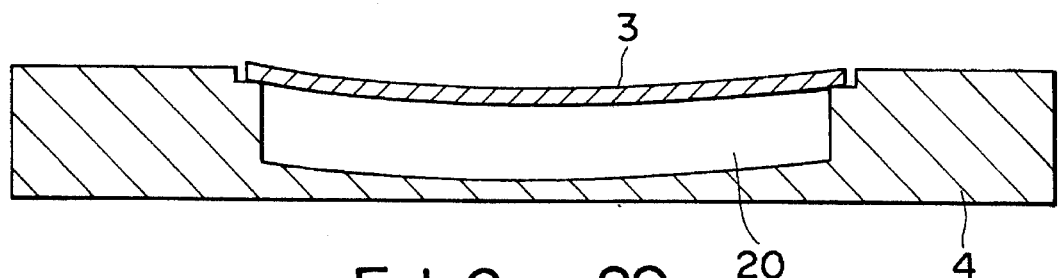
F I G. 29
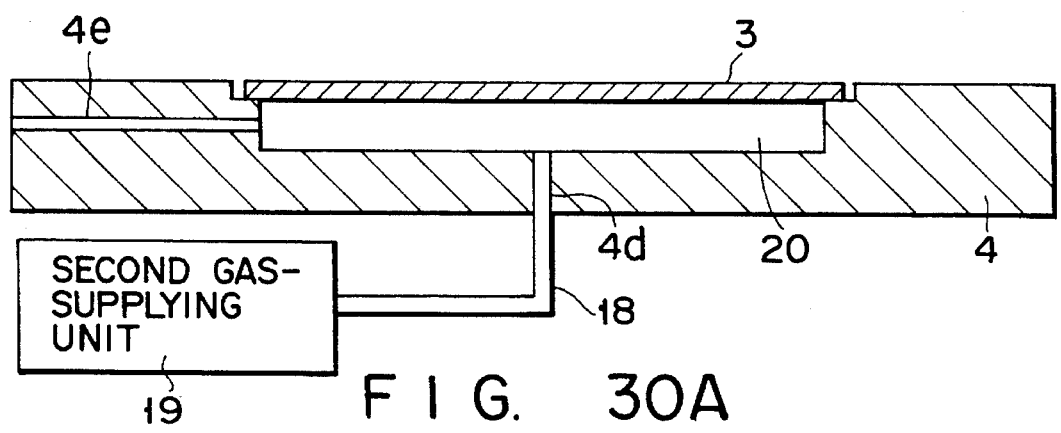
F I G. 30A
F I G. 30B
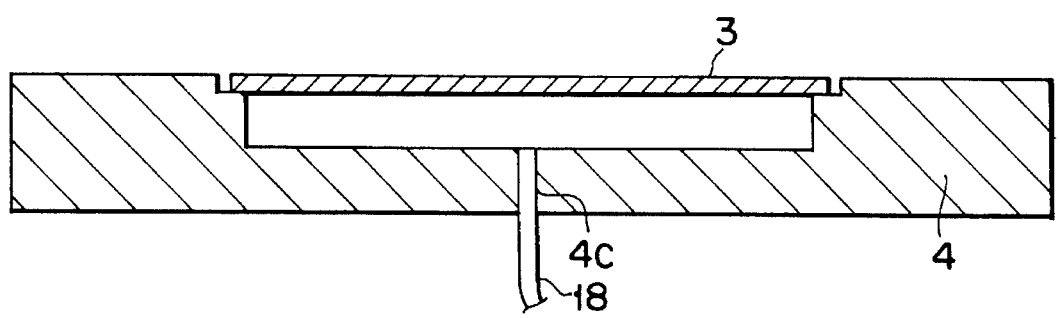
F I G. 31

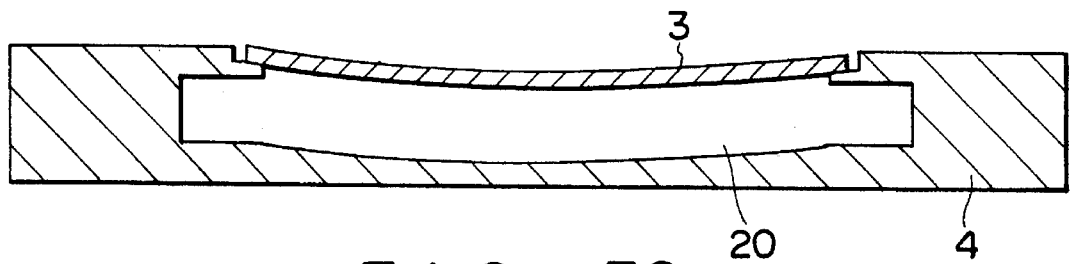
FIG. 32
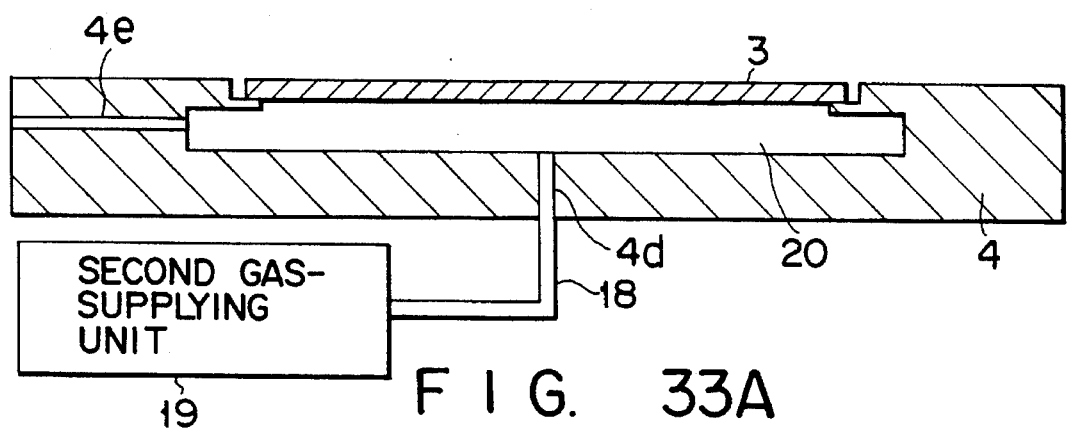
FIG. 33A
FIG. 33B
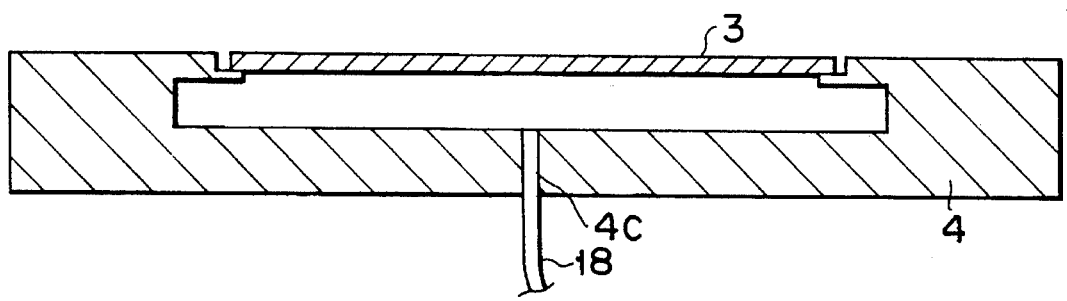
FIG. 34

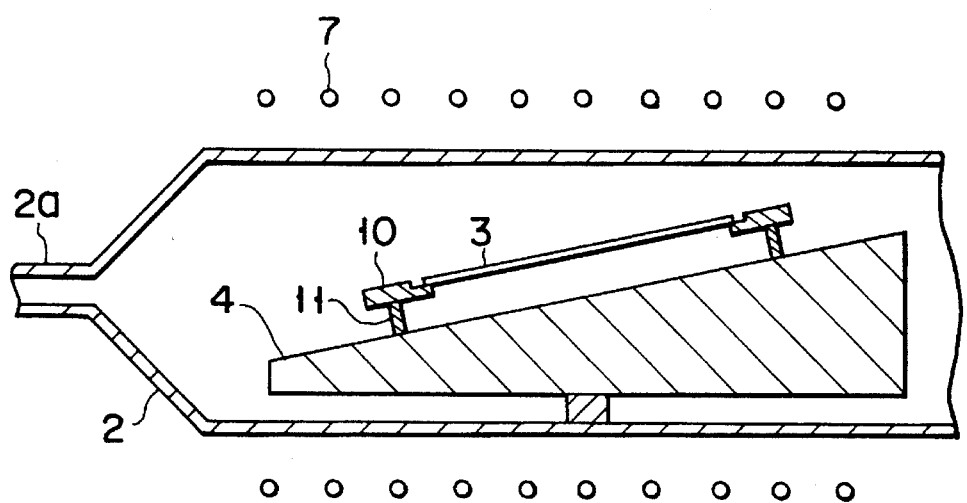
F I G. 39
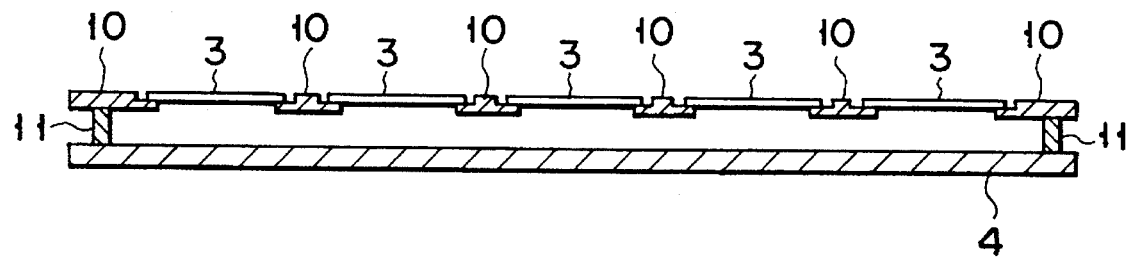
F I G. 40

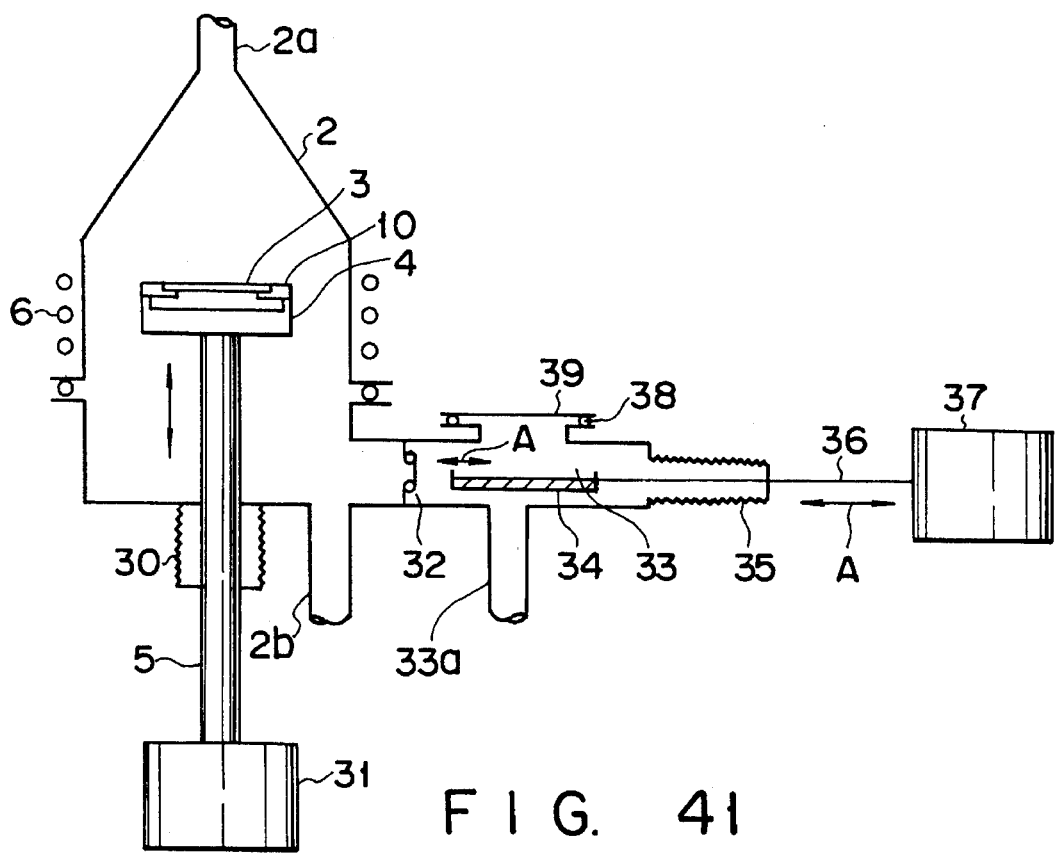
F I G. 41
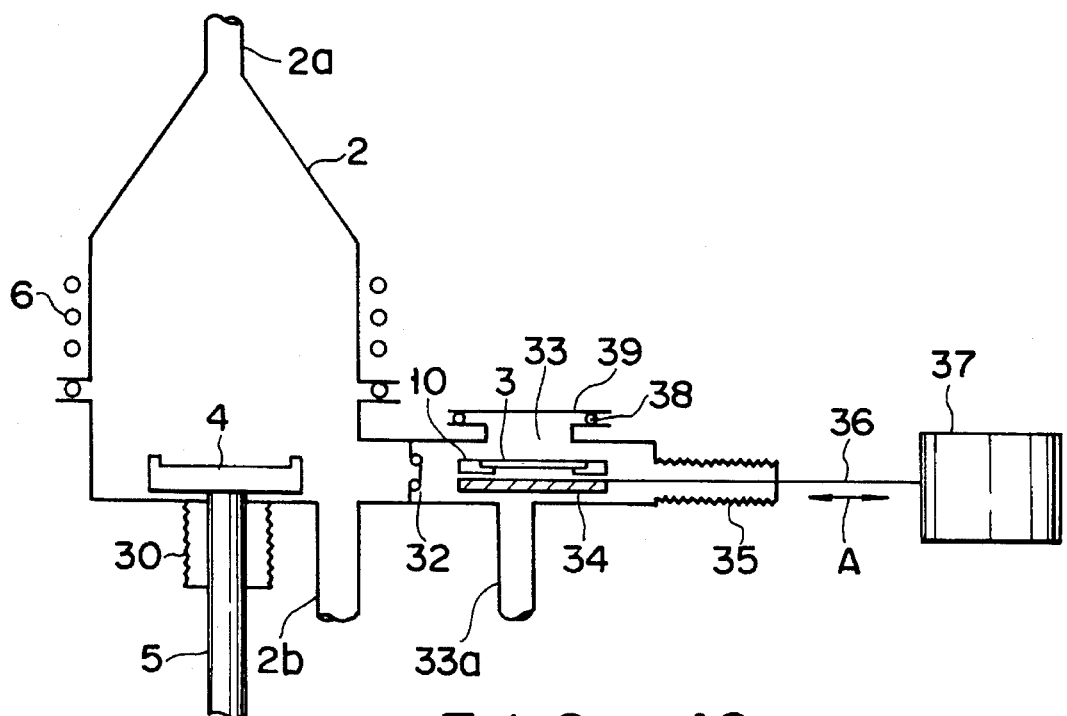
F I G. 42

VAPOR-PHASE DEPOSITION APPARATUS AND VAPOR-PHASE DEPOSITION METHOD

This application is a Continuation of application Ser. No. 07/672,120, filed on Mar. 19, 1991, now abandoned.

BACKGROUND OF THE INVENTION

1. Field of the Invention

The present invention relates to a vapor-phase deposition apparatus and a vapor-phase deposition method, either designed for use in manufacture of semi-conductor devices or the like.

2. Description of the Related Art

Various vapor-phase deposition apparatuses are known which performs vapor-phase deposition to form semiconductor films or the like on a crystal substrate, thereby to manufacture semiconductor devices or the like. A typical vapor-phase deposition apparatus comprises a base plate, a reaction vessel secured to the base plate in airtight fashion, a shaft passing through the base plate into the vessel, a substrate holder located within the vessel and rotatably supported by the shaft, for holding a crystal substrate, and a heater located within the vessel, for heating the holder and a crystal substrate held by the holder.

The reaction vessel has a gas-inlet port in the top, and a gas-outlet port in the bottom. Gases (e.g., feed gas, carrier gas, etc.) are supplied into the vessel through the gas-inlet port. Any gas that is left unreacted in the vessel is discharged through the gas-outlet port.

In operation, the heater heats the crystal substrate, which is held by the holder, to a predetermined temperature. Then, feed gas ($SiH_4$, $SiH_2Cl_2$, $SiHCl_3$, $SiCl_4$, $Si_2H_6$, or the like) are supplied into the reaction vessel through the gas-inlet port, along with carrier gas ($H_2$ or the like).

In most cases, a device having a lamp, a high-frequency wave generator, or a electric resistor is utilized as a heater to heat the substrate held by the holder to the predetermined temperature. Whatever heating device is used, it is necessary to heat the substrate uniformly. To this end, use can be made of a substrate holder having a recess in which to hold a crystal substrate, as is disclosed in Published Unexamined Japanese Patent Application No. 61-215289 and No. 62-4315. Even if heated while held by this holder, a substrate is heated more at its peripheral part than at the center part since the peripheral part contacts the holder. Consequently, it is very difficult to form a crystal film having a uniform thickness, on the substrate.

Recently, it is increasingly demanded that a substrate be used in its entirety. In other words, it is desired that the peripheral part of a substrate should not be cut and discarded, in order to save material. Hence, there is a great demand for a technique of forming a crystal film having a uniform thickness on the substrate, and the difference in temperature between the peripheral part and center part of the substrate can no longer be ignored.

Moreover, once the substrate warps due to the difference in temperature between the upper and lower surfaces of the substrate, the gap between the substrate and the surface of the holder changes. This temperature distribution of the substrate and the change in the surface temperature distribution results in stress. The stress is great, in particularly when the substrate is made of single-crystal silicon. It causes transition of the single-crystal silicon, which is known as "slip." The slip deteriorates the characteristics of the semiconductor devices formed on the silicon substrate.

The slip is a phenomenon that crystal molecules glides along crystal lattices and are deformed when the stress, caused by the non-uniform distribution of surface temperature of the substrate heated to a high temperature, increases above the yield point of the crystal substrate. As is known in the art, the higher the temperature of the crystal substrate, the lower the yield point of the substrate, and the higher the probability of slip.

Also, the substrate must be cooled to a low temperature some time before it is placed on and removed from the holder. It would otherwise be difficult to place the substrate on the holder, and to remove it from the holder.

As has been pointed out, in the conventional vapor-phase deposition apparatus, the peripheral part of a substrate, which contacts the holder, is more heated than the center part which does not contact the holder. The non-uniform temperature distribution of the substrate inevitably makes it difficult to form a crystal film having a uniform thickness, on the substrate. Further, once the substrate warps due to the difference in temperature between the upper and lower surfaces of the substrate, the gap between the substrate and the surface of the holder changes, inevitably changing the surface temperature distribution of the substrate. The change of the surface temperature distribution results in two problems. First, it is impossible to form a crystal film having a uniform physical property such as carrier concentration. Second, the substrate has stress, which causes transition of the single-crystal silicon, such as slip, ultimately deteriorating the characteristics of the semiconductor devices formed on the silicon substrate. Moreover, the substrate must be cooled to a lower temperature some time before it is placed on and removed from the holder, in order to facilitate the placing and removal of the substrate. Needless to say, the cooling of the substrate is a bar to enhancement of throughput of the vapor-phase deposition apparatus.

SUMMARY OF THE INVENTION

The object of the present invention is to provide a vapor-phase deposition apparatus which can impart a uniform surface-temperature distribution to a crystal substrate, causing no transition such as slip in the substrate and, thus, making it possible to form semiconductor devices on the substrate which have good characteristics.

To achieve this object, according to the present invention, there are provided various vapor-phase deposition apparatuses.

More specifically, according to a first aspect of the invention, there is provided a vapor-phase deposition apparatus comprising: substrate-supporting means for supporting a substrate; heating means for heating the substrate-supporting means; and gas-supplying means for supplying gas for forming a thin film on the substrate supported by the substrate-supporting means. The substrate-supporting means comprises two members and a support member. The first member is heated to a predetermined temperature by the heating means. The second member supports the peripheral part of the substrate, thus supporting the substrate. The support member supports the second member on the first member and is located outside a periphery of the substrate.

According to a second aspect of the invention, there is provided a vapor-phase deposition apparatus comprising: substrate-supporting means for supporting a substrate; heating means for heating the substrate-supporting means; and gas-supplying means for supplying gas for forming a thin film on the substrate supported by the substrate-supporting means. The substrate-supporting means has a circular recess having a diameter greater than that of the substrate, and comprises a support member for supporting the peripheral part of the substrate.

According to a third aspect of this invention, there is provided a vapor-phase deposition apparatus comprising: substrate-supporting means for supporting a substrate; heating means for heating the substrate-supporting means; and gas-supplying means for supplying gas for forming a thin film on the substrate supported by the substrate-supporting means. The substrate-supporting means comprises two members. The first member is heated to a predetermined temperature by the heating means and has a circular recess with a diameter greater than that of the substrate. The second member is supported by the first member and located above the circular recess, for supporting the peripheral part of the substrate.

According to a fourth aspect of this invention, there is provided a vapor-phase deposition apparatus comprising: substrate-supporting means for supporting a substrate; heating means for heating the substrate-supporting means; and gas-supplying means for supplying gas for forming a thin film on the substrate supported by the substrate-supporting means. The substrate-supporting means comprises two members. The first member is heated to a predetermined temperature by the heating means. The second member is made of material having a thermal conductivity less than that of the first member, and is provided on the first member, for supporting the peripheral part of the substrate.

According to a fifth aspect of this invention, there is provided a vapor-phase deposition apparatus comprising: substrate-supporting means for supporting a substrate; heating means for heating the substrate-supporting means; and gas-supplying means for supplying gas for forming a thin film on the substrate supported by the substrate-supporting means. The substrate-supporting means has a substrate-supporting member which is to be heated to a predetermined temperature by the heating means and which has a recess having a concave bottom having a radius of curvature substantially equal to the value which the substrate will have when it is heated and warped, and being spaced away from the substrate by a distance of at least 1 mm.

According to a sixth aspect of the invention, there is provided a vapor-phase deposition apparatus comprising: substrate-supporting means for supporting a substrate; heating means for heating the substrate-supporting means; and first gas-supplying means for supplying a first gas for forming a thin film on the substrate supported by the substrate-supporting means. The substrate-supporting means comprises a substrate-supporting member and second gas-supplying means. The substrate-supporting member is to be heated to a predetermined temperature by the heating means, has a recess defining a space with the substrate when the substrate is mounted on the substrate-supporting member. The second gas-supplying means supplies a second gas into the space defined by the substrate and the substrate-supporting member.

According to a seventh aspect of this invention, there is provided a vapor-phase deposition apparatus comprising: substrate-supporting means for supporting a substrate; heating means for heating the substrate-supporting means; and gas-supplying means for supplying gas for forming a thin film on the substrate supported by the substrate-supporting means. The substrate-supporting means comprises two members and one support member. The first member is heated to a predetermined temperature by the heating means. The second member supports the peripheral part of the substrate. The support member supports the second member such that the second member opposes the first member, spaced away from the first member.

According to an eighth aspect of this invention, there is provided a vapor-phase deposition apparatus comprising: substrate-supporting means for supporting a substrate; heating means for heating the substrate-supporting means; and gas-supplying means for supplying gas for forming a thin film on the substrate supported by the substrate-supporting means. The substrate-supporting means comprises two members. The first member is heated to a predetermined temperature by the heating means. The second member is made of material having emissibility substantially equal to that of the substrate, and supports the peripheral part of the substrate, thus supporting the substrate with respect to the first member.

According to a ninth aspect of this invention, there is provided a vapor-phase deposition apparatus comprising: substrate-supporting means for supporting a substrate; heating means for heating the substrate-supporting means; and gas-supplying means for supplying gas for forming a thin film on the substrate supported by the substrate-supporting means. The substrate-supporting means comprises two members. The first member is heated to a predetermined temperature by the heating means. The second member is made of material having a heat capacity per unit area, which is substantially equal to that of the substrate, and supports the peripheral part of the substrate, thereby supporting the substrate with respect to the first member.

The most prominent problem with a typical vapor-phase deposition apparatus is the slip occurring in the substrate, due to thermal stress resulting from the non-uniform distribution of surface temperature of the substrate. The inventors hereof repeated experiments and analyzed the results of the experiments, in order to ascertain the relation between the heat-transmission in and heat-radiation from substrates, on the one hand, and the stress developed in the substrates, on the other hand. Finally they discovered that the stress due to the temperature difference between the upper and lower surfaces of a substrate was not the immediate cause of the slip in the substrate. Rather, as they found, the temperature distribution in the radial direction of the substrate was not uniform because the substrate warped due to the temperature difference, and this non-uniform surface-temperature distribution was the very cause of the slip.

Therefore, to prevent slip from occurring in a substrate, the temperature difference between the surfaces of the substrate is not necessarily reduced by heating both surfaces of the substrate by applying lamp heating thereto, though it has hitherto been thought necessary to reduce said temperature difference. To prevent slip, it is suffices to make the surface-temperature distribution uniform.

Hence, the inventors hereof invented various methods of rendering the surface-temperature distribution uniform, no matter whether the surface-temperature distribution is not uniform due to the warping of the substrate, the heat transmission by a member supporting the substrate, or any other cause.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a cross-sectional view illustrating a vapor-phase deposition apparatus according to a first embodiment of the invention;

FIG. 2 is an enlarged, cross-sectional view showing the substrate-supporting unit of the apparatus shown in FIG. 1 and a substrate supported by the unit;

FIG. 3 is a graph representing the relation between the temperature T of the substrate and the distance d between the holder and the substrate;

FIG. 18 is an enlarged, cross-sectional view of a first modification of the substrate-supporting unit illustrated in FIG. 2;

FIG. 19 is an enlarged, cross-sectional view of a second modification of the substrate-supporting unit shown in FIG. 2;

FIG. 21 is a circuit diagram showing a device for independently controlling the temperature of the center part of a substrate and that of the peripheral part thereof;

FIG. 23 is an enlarged, cross-sectional view showing another type of a substrate-supporting unit according to the present invention;

FIG. 24 is an enlarged, cross-sectional view showing still another type of a substrate-supporting unit according to the present invention;

FIG. 25 is an enlarged, cross-sectional view showing another substrate-supporting unit according to the present invention;

FIG. 26 is an enlarged, cross-sectional view illustrating the substrate-supporting unit used in a fourth embodiment of the invention;

FIG. 27 is an enlarged, cross-sectional view showing a first modification of the substrate-supporting unit illustrated in FIG. 26;

FIG. 28 is a plan view showing a second modification of the substrate-supporting unit illustrated in FIG. 26;

FIG. 29 is an enlarged, cross-sectional view illustrating the substrate holder for use in a fifth embodiment of the present invention;

FIGS. 30A and 30B are enlarged, cross-sectional views showing another type of a substrate holder for use in the fifth embodiment;

FIG. 31 is an enlarged, cross-sectional view showing the substrate holder which is a modification of the holder illustrated in FIGS. 30A and 30B;

FIGS. 32 to 34 are enlarged, cross-sectional views showing the modifications of the substrate holders illustrated FIGS. 29, 30A, 30B, and 31;

FIGS. 38 and 39 are sectional views illustrating two other types of vapor-phase deposition apparatuses, according to the present invention;

FIG. 40 is a sectional view showing another modified substrate-supporting unit; and FIGS. 41 and 42 are schematic views of a vapor-phase deposition apparatus according to the invention, explaining how to transfer a substrate into, and out of, the reaction vessel of the apparatus.

DETAILED DESCRIPTION OF THE PREFERRED EMBODIMENTS

Figure 4:
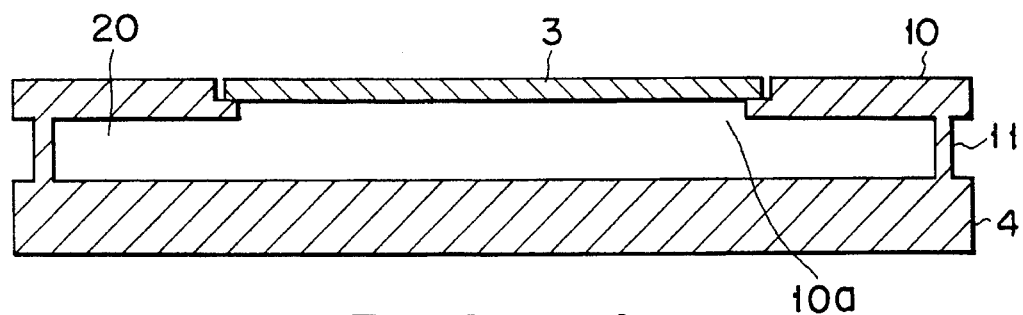
FIG. 4 is an enlarged, cross-sectional view of a first modification of the substrate-supporting unit shown in FIG. 2.

Embodiments of the invention will now be described with reference to the accompanying drawings.

FIG. 1 illustrates a vapor-phase deposition apparatus according to a first embodiment of the invention. As is shown in this figure, the apparatus comprises a base plate 1, a reaction vessel 2 secured to the base plate 1 in airtight fashion, a disc-shaped substrate holder 4 located within the vessel 2, for supporting a crystal substrate 3, a vertical shaft 5 passing through the base plate 1 into the vessel 2, a heater 6 provided in the vessel 2, for heating both the substrate 3 and the holder 4, a drive unit 8 located below the base plate 1, and a gas-supplying unit 9 located outside the vessel 1. The upper end of the shaft 5 is detachably connected to the substrate holder 4, and the lower end of the shaft 5 is connected to the drive unit 8.

As FIG. 1 shows, the reaction vessel 2 has a gas-inlet port 2a, and the base plate 1 has a gas-outlet port 2b. The gas-supplying unit 9 is coupled to the gas-inlet port 2a, for supplying a feed gas and a carrier gas into the reaction vessel 2 through the gas-inlet port 2a. The gases left unreacted in the vessel 2 is discharged from the vessel 2 through the gas-outlet port 2b.

The heater 6, which is placed right below the substrate holder 4, heats the holder 4. The holder 4, thus heated, heats the substrate 3 to a predetermined temperature. The feed gas is applied to the heated substrate 3 supplied through the port 2a, together with the carrier gas supplied also through the port 2a. As a result of this, vapor-phase deposition takes place on the upper surface of the substrate 3, forming a thin semiconductor film thereon.

FIG. 2 is an enlarged, cross-sectional view showing the substrate 3 and the substrate holder 4, both illustrated in FIG. 1. As is evident from FIG. 2, three support posts 11 protrude upward from the peripheral edge of the holder 4, and a substrate-supporting member 10 is supported by the posts 11, with its peripheral edge contacting the support posts 11. The three posts 11 can be replaced by one support post, two support posts, or four or more support posts. Alternatively, it can be replaced by a ring-shaped wall fixed to the peripheral edge of the holder 4.

The substrate-supporting member 10 has a center hole 10a having a diameter slightly less than that of the crystal substrate 3. The hole 10a is defined by a stepped portion of the substrate-supporting member 10. Only the peripheral part of the substrate 4 contacts this stepped portion, whereby the substrate 3 is supported by the member 10, and the member 10 is connected to the holder 4 by the thin support posts 11 only. The member 10 and the posts 11 constitute long heat paths each having a small cross-sectional area. Hence, the heat which is transmitted from the holder 4 to the peripheral part of the substrate 3 through these heat paths is negligible, far less than the heat radiated from the holder 4 to the substrate 3 and than the heat conducted from the holder 4 to the substrate 3 via the gas (i.e., the carrier gas $H_2$) existing in the gap between the substrate 3 and the holder 4.

Let us assume that the amount of heat radiated from the substrate 3 is equal to the amount of heat applied from the holder 4 to the substrate, by virtue of the law of conservation of heat. Then, the temperature T of the substrate 3 and the distance D between the substrate 3 and the holder 4 have the relationship shown in the graph of FIG. 3, provided the temperature of the holder 4 is maintained at a fixed value by means of the heater 6.

As can be understood from FIG. 3, the temperature of the substrate 3 greatly changes with the distance D, as long as the distance D is equal to or less than 1 mm. When the distance D is greater than 1 mm, however, the temperature of the substrate 3 changes with the distance D, but not so much. It follows that the temperature of the substrate 3 will remain fairly uniform even if the substrate warps due to the temperature difference between the upper and lower surfaces of the substrate 3, provided that the distance D is set at more than 1 mm.

Hence, in the embodiment shown in FIG. 2, the substrate 3 is spaced apart from the holder 4 by a distance of 5 mm, and the substrate-supporting member 10 is spaced apart from the holder 4 by a distance of 4 mm. The substrate holder 4 is uniformly heated by the heater 6, and the substrate 3 is uniformly heated by virtue of the heat radiated from the holder 4 and the heat conducted therefrom through the carrier gas existing in the gap between the substrate 3 and the holder 4.

While the substrate 3 is heated, the drive unit 8 rotates the vertical shaft 5 at the speed of, for example, 10 rpm, thereby rotating the holder 4 and hence the substrate 3.

The substrate-supporting member 10 is heated, also by virtue of the heat radiated from the holder 4 and the heat conducted therefrom through the carrier gas existing in the gap between the substrate 3 and the holder 4. Scarcely is it heated by the heat conduction from the holder 4 through the support posts 11. Hence, the member 10 is heated to substantially the same temperature as the crystal substrate 3, and the peripheral part of the substrate 3, which contacts the member 10, is heated neither more or less than any other part.

In the embodiment shown in FIG. 2, the holder 4, the member 10, and support posts 11 are separate components and assembled together, constituting a substrate-supporting unit. Instead, these components can be formed integrally as is illustrated in FIG. 4, thus forming a substrate-supporting unit. The unit has a disc-shaped hollow 20 which has a diameter greater than that of the crystal substrate 3. Due to this, the heat path extending from the holder 4 to the substrate 3, formed of an annular portion 10 and a ring-shaped wall 11, is so long that only a negligibly small amount of heat is conducted from the holder 4 to the peripheral part of the substrate 3. Hence, the peripheral part of the substrate 3 is heated to substantially the same temperature as any other part.

Figure 5:
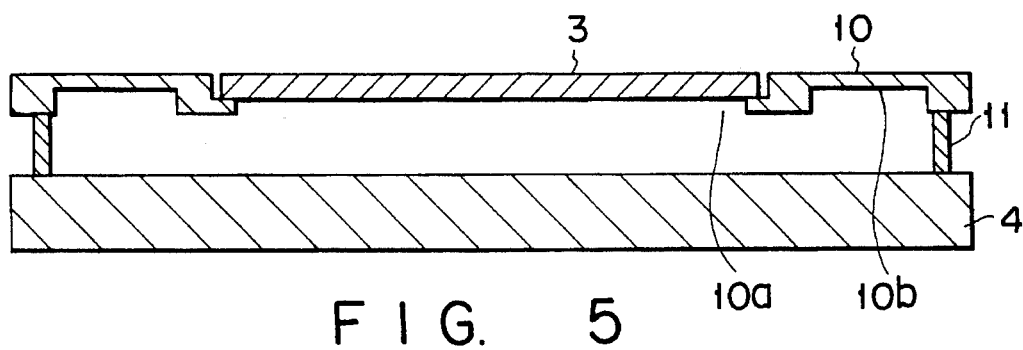
FIG. 5 is an enlarged, cross-sectional view of a second modification of the substrate-supporting unit.

FIG. 5 illustrates a substrate-supporting unit, which is a second modification of the unit shown in FIG. 2. As is evident from FIG. 5, this modification is characterized in that the substrate-supporting member 10 has a thin portion 10a. Because of the thin portion 10a, each of the heat paths has a reduced cross-sectional area and, hence, conducts less heat from the holder 4 to the substrate 3, than does each heat path of the substrate-supporting unit illustrated in FIG. 2.

Figure 6:
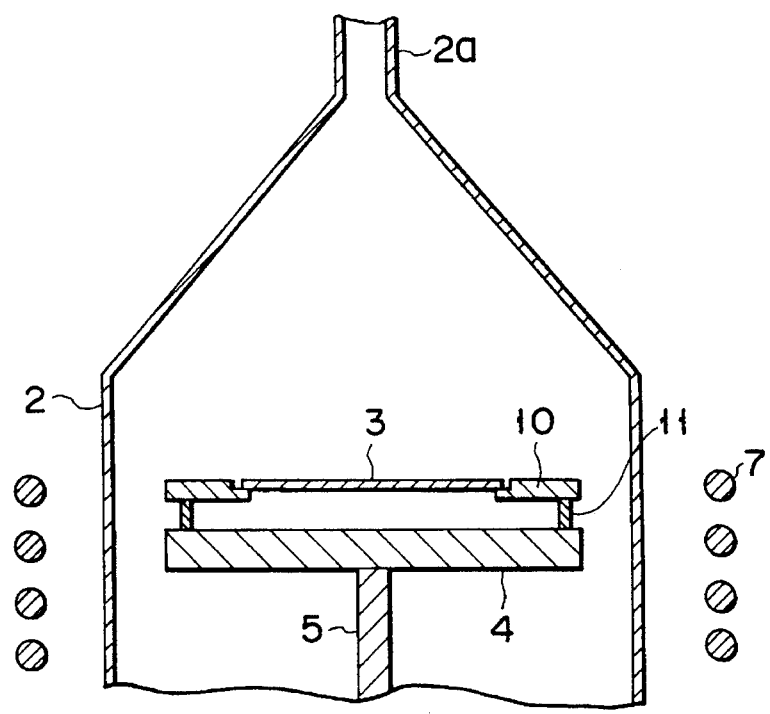
FIG. 6 is a vertical sectional view illustrating a vapor-phase deposition apparatus according to a second embodiment of the present invention.

FIG. 6 is a vertical sectional view illustrating a vapor-phase deposition apparatus which is a second embodiment of the invention. This apparatus is characterized in two respects. First, a heater coil 7, which is wound around the vessel 2, is used in place of a heater located within the vessel 2. Second, the substrate-supporting member 10 and the ring-shaped wall 11 are made of material, such as glass or ceramics, which is hardly heated by the coil unlike the material of the holder 4 which is used as susceptor. The peripheral part of the substrate 3, contacting the member 10, is therefore heated neither more or less than any other part. As a result, heat is distributed uniformly in the substrate 3.

In the substrate-supporting units shown in FIGS. 4, 5, and 6, the ring-shaped wall 11 can be replaced by, for example, three support posts. In this case, the annular portion or the substrate-supporting member 10 can be replaced by three components shaped like Japanese fan, secured to the three posts, respectively, and arranged in a circle.

Figure 7:
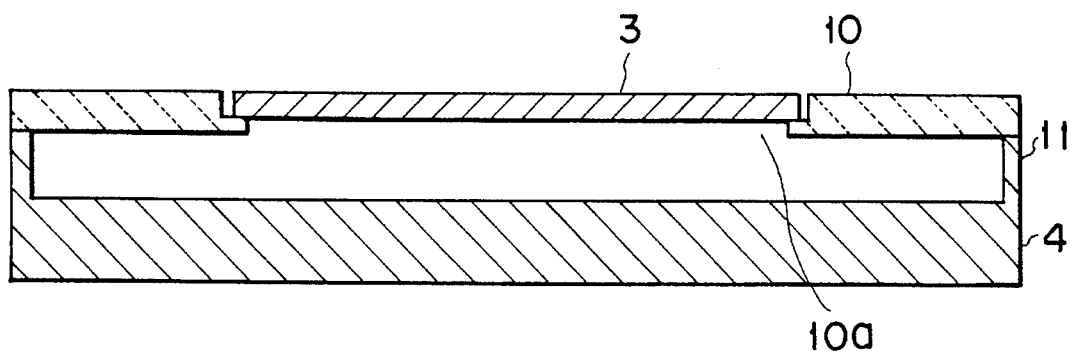
FIG. 7 is an enlarged, cross-sectional view of a third modification of the substrate-supporting unit.

FIG. 7 illustrates a third modification of the substrate-supporting unit shown in FIG. 2. As is evident from FIG. 7, the substrate-supporting unit is characterized in two respects. First, the holder 4 and the ring-shaped wall 11 are integrally formed. Second, the substrate-supporting member 10 is made of material having a low thermal conductivity, such as glass or ceramics. Since the member 10 is made of such material, only a negligibly small amount of heat is conducted from the holder 4 to the peripheral part of the substrate 3 through the wall 11 and the member 10. Therefore, the heat distribution in the substrate 3 is substantially uniform. The ring-shaped wall 11 can, of course, be made of the same material as the member 10.

Figure 8:
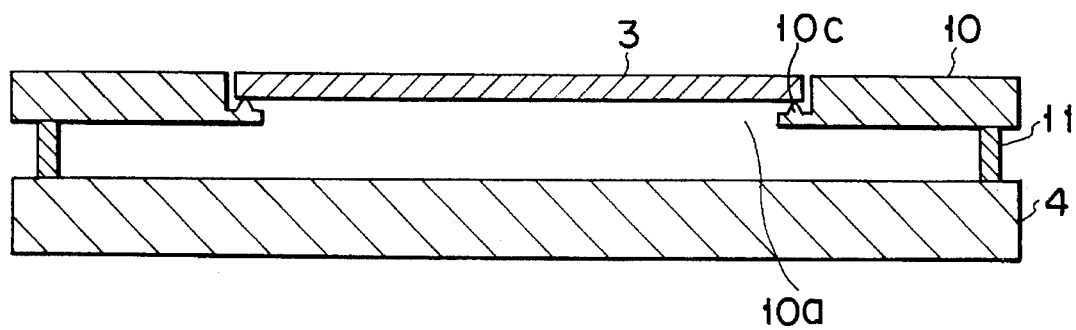
FIGS. 8 and 9 are, respectively, an enlarged, cross-sectional view and a plan view of a fourth modification of the substrate-supporting unit shown in FIG. 2.
Figure 9:
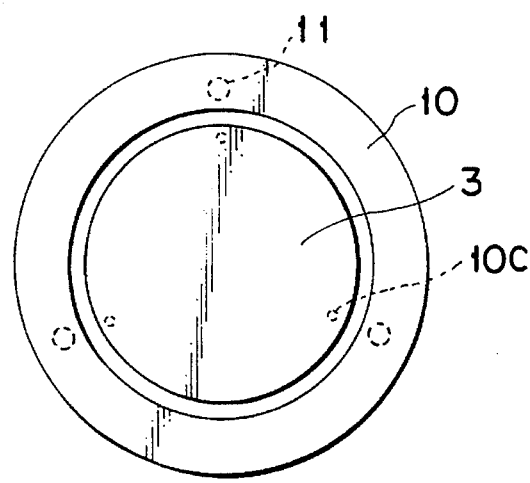

FIGS. 8 and 9 show a fourth modification of the substrate-supporting unit illustrated in FIG. 2, the former being an enlarged, cross-sectional view, and the latter being a plan view. This modification is identical to the unit shown in FIG. 2, except that three pointed protrusions 10c are formed on the stepped portion at the edge of the hole 10a of the member 10. Hence, the substrate 3 is set in three-point contact with the substrate-supporting member 10. This reduces the cross-sectional area of the heat path extending from the holder 4 to the peripheral part of the substrate 3. Therefore, the heat distribution in the substrate 3 is more uniform than in the case where the substrate 3 is supported by the unit of FIG. 2. Needless to say, the pointed protrusions 10c can be replaced by a thin annular wall 10c, in which case the substrate 3 is placed in line-contact with the substrate-supporting member 10.

Figure 10:
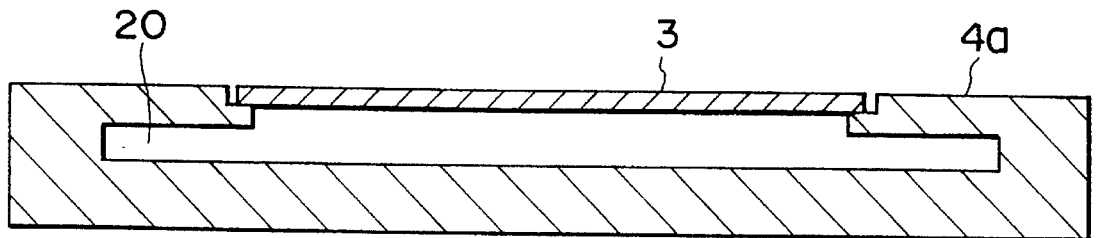
FIG. 10 is an enlarged, cross-sectional view of the substrate-supporting unit employed in a third embodiment of the invention.

FIG. 10 is an enlarged, cross-sectional view of the substrate-supporting unit employed in a third embodiment of the invention. As is shown in FIG. 10, the unit is made by forming a disc-shaped hollow 20 in a disc-shaped block 4. The unit has a center hole made in the top wall and having a diameter smaller than that of a crystal substrate 3. A stepped portion is formed at the edge of the center hole. The substrate is placed on the annular top portion, i.e., the substrate-supporting portion 4a, with its peripheral part resting on the stepped portion.

Figure 11:
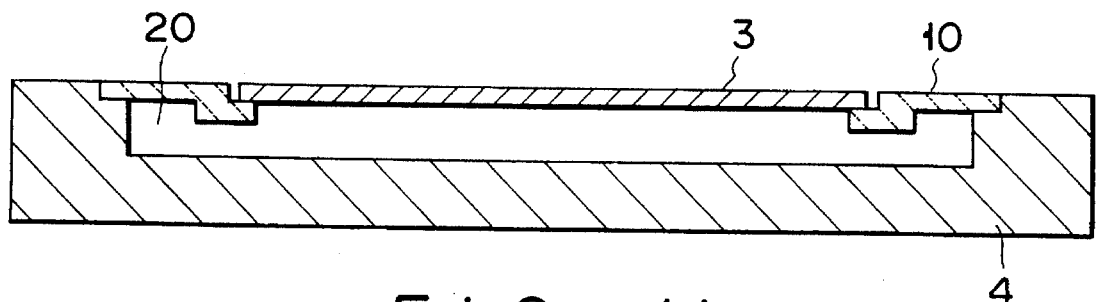
FIG. 11 is an enlarged, cross-sectional view of a first modification of the substrate-supporting unit illustrated in FIG. 10.

FIG. 11 illustrates a first modification of the substrate-supporting unit illustrated in FIG. 10. This modified unit comprises a disc-shaped block having a circular recess 20 and an annular substrate-supporting member 10 secured to the top of the block, with its upper surface in the same plane as the top of the block. The substrate-supporting member 10 is made of material having a low thermal conductivity, such as glass or ceramics. The member 10 has an inside diameter which is smaller than that of a substrate 3, and has a stepped portion at its inner edge. The substrate 3 is supported by the member 10, with its peripheral part resting upon the stepped portion of the member 10.

Figure 12:
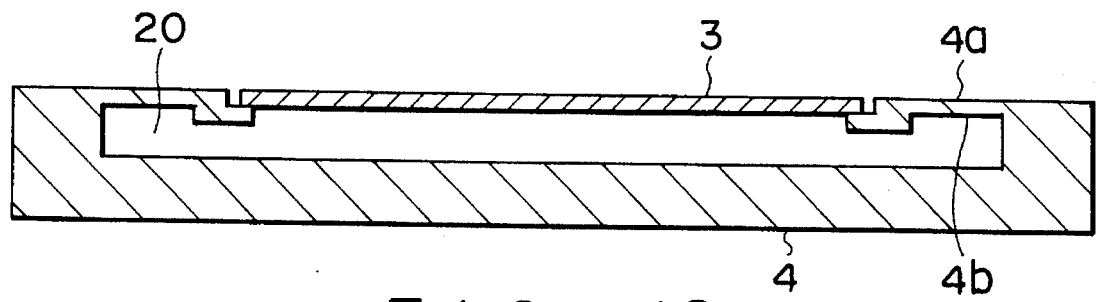
FIG. 12 is an enlarged, cross-sectional view of a second modification of the substrate-supporting unit shown in FIG. 10.

FIG. 12 shows a second modification of the substrate-supporting unit shown in FIG. 10. This unit different from the unit of FIG. 10, only in that the substrate-supporting portion 4a has a thin portion 4b. Because of the thin portion 4b, the heat path extending from the bottom portion to the peripheral part of the substrate 3 has a reduced cross-sectional area and, hence, conducts less heat than does the heat path of the substrate-supporting unit illustrated in FIG. 10.

Figure 13:
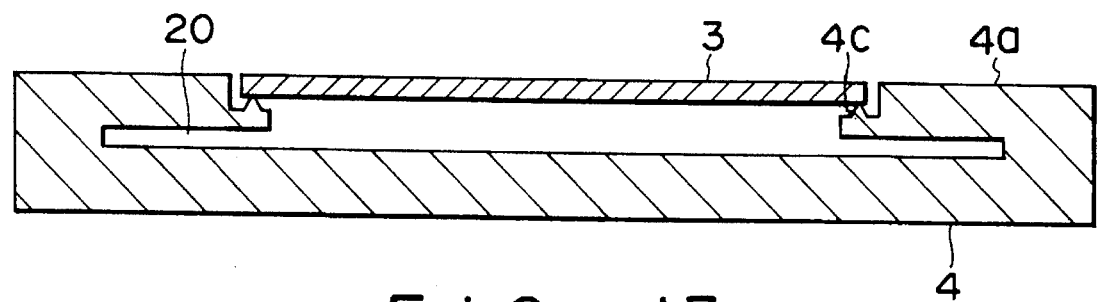
FIG. 13 is an enlarged, cross-sectional view of a third modification of the substrate-supporting unit shown in FIG. 10.

FIG. 13 is an enlarged, cross-sectional view of a third modification of the substrate-supporting unit shown in FIG. 10. This modification is identical to the unit of FIG. 10, except that an annular thin wall or a plurality of pointed protrusions 4c are integrally formed on the stepped portion. Hence, the substrate 3 is set in line-contact or point-contact with the substrate-supporting member 10. This reduces the cross-sectional area of the heat path extending from the bottom portion to the peripheral part of the substrate 3. Therefore, the heat distribution in the substrate 3 is more uniform than in the case where the substrate 3 is supported by the unit illustrated in FIG. 10.

Figure 14:
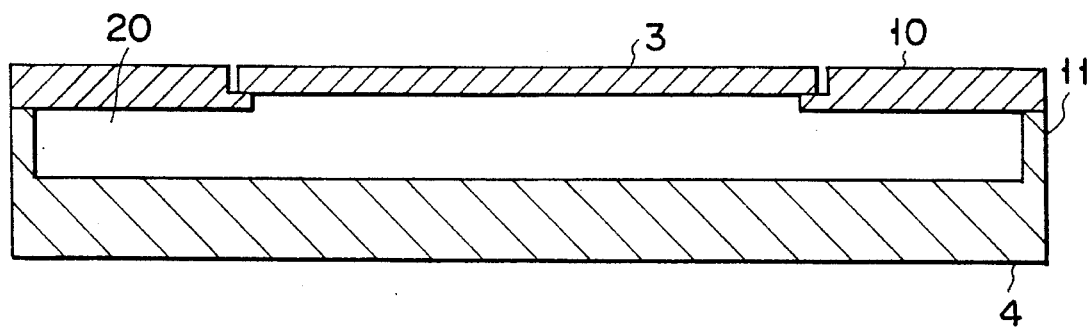
FIG. 14 is an enlarged, cross-sectional view of a modification of the substrate-supporting unit shown in FIG. 7.
Figure 15:
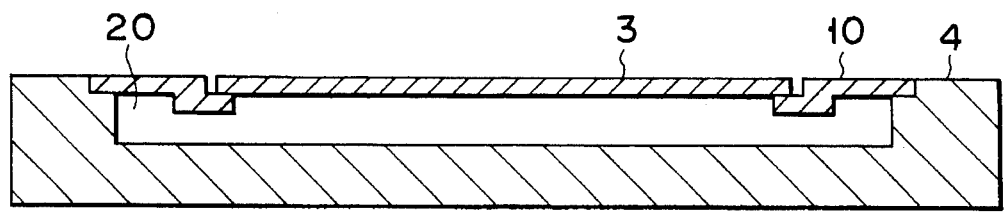
FIG. 15 is an enlarged, cross-sectional view of a modification of the substrate-supporting unit illustrated in FIG. 11.

FIG. 14 shows a modification of the substrate-supporting units of FIG. 7, and FIG. 15 illustrates a modification of the substrate-supporting unit shown in FIGS. 10 and 11. As can be understood from FIGS. 14 and 15, these substrate-supporting units are identical to the units of FIGS. 7 and 11, except that the substrate-supporting member 10 is made of a specific material as will be described later in detail.

Both units of FIGS. 14 and 15 have a disc-shaped hollow 20 which has a diameter greater than that of the crystal substrate 3. Due to this, the heat path extending from the bottom portion of the block 4 to the peripheral part of the substrate 3, formed of an annular wall 11 and the substrate-supporting member 10, is so long that only a negligibly small amount of heat is conducted from the holder 4 to the peripheral part of the substrate 3. Hence, the peripheral part of the substrate 3 is heated to substantially the same temperature as any other part.

The heat conducted to the substrate 3 through the heat path is negligibly small, the substrate 3 is heated, virtually by only the heat radiated from the holder 4 and the heat conducted therefrom through the carrier gas existing in the gap between the substrate 3 and the holder 4.

Means, other than the long heat path, is used in the modified units of FIGS. 14 and 15 in order to reduce, even more, the temperature difference between the center and peripheral parts of the substrate 3. More specifically, the substrate-supporting member 10 is made of material having emissibility which is substantially equal to that of the substrate 3, or has surface roughness which is substantially equal to that of the substrate 3. As is known in the art, the emissibility of a member is inversely proportional to the surface roughness of the member. In other words, the less the surface roughness, the higher the emissibility; the greater the surface roughness, the lower the emissibility.

To be more specific, if the substrate is made of silicon, the member 10 is made of the material having emissibility substantially equal to that of silicon, or has a surface roughness substantially equal to that of the substrate 3. As a result of this, the substrate 3 and the member 10 are heated to substantially the same temperature as the block 4 is heated by a heater 6 (not shown). There is but an extremely small temperature difference between the center and peripheral parts of the substrate 3. In other words, the substrate 3 has a uniform surface-temperature distribution.

Alternatively, in order to impart a uniform surface-temperature distribution to the substrate, the substrate-supporting member 10 is made of material having substantially the same heat capacity per unit area as that of the substrate 3. In this instance, the substrate 3 has virtually no thermal stress, and hence the molecules of the substrate undergo virtually no slip. If the substrate-supporting member 10 had a heat capacity per unit area which is different from that of the substrate 3, the substrate 3 should have a non-uniform surface-temperature distribution, and should inevitably have a thermal stress, which would cause slip or glide of the substrate molecules.

Figure 16:
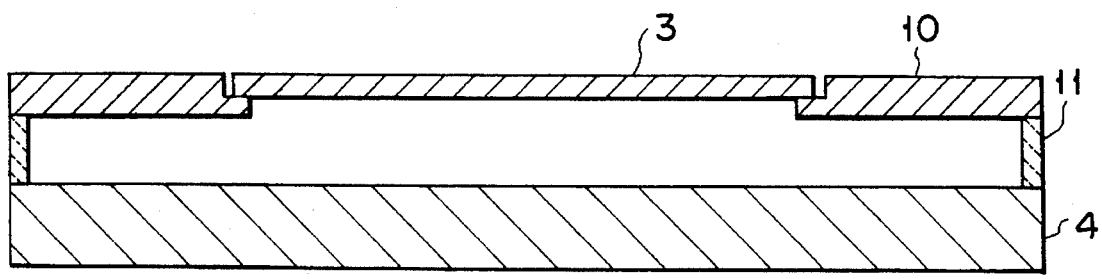
FIG. 16 is an enlarged, cross-sectional view of a modification of the substrate-supporting unit shown in FIG. 14.
Figure 17:
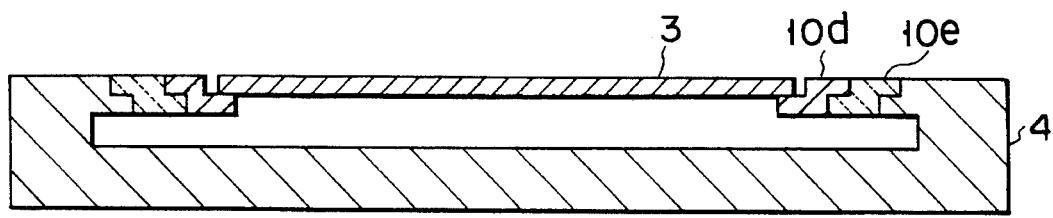
FIG. 17 is an enlarged, cross-sectional view of a modification of the substrate-supporting unit shown in FIG. 15.

FIG. 16 shows a modification of the substrate-supporting unit illustrated in FIG. 14, and FIG. 17 shows a modification of the substrate-supporting unit shown in FIG. 15. The unit of FIG. 16 is characterized in that the annular wall 11 is made of material having low thermal conductivity. The unit of FIG. 17 is characterized in that the substrate-supporting member 10 consists of two components 10d and 10e. The first component 10d is made of material which has the same emissibility or the same heat capacity per unit area, as the substrate 3, and the second component 10e is made of material which has lower emissibility or less heat capacity per unit area, than that of the substrate 3. Hence, the wall 11 or component 10e conducts less heat to the peripheral part of the substrate 3 than in the unit illustrated in FIG. 14 or 15.

In the substrate-supporting units illustrated in FIGS. 14 to 17, it is most desirable that the member 10, which needs to have the same emissibility or the same heat capacity as the substrate 3, be made of the material identical to that of the substrate 3. Hence, if the substrate 3 is a silicon substrate, the member 10 should best be made of silicon. In other words, it suffices to support the substrate 4 by means of an annular dummy substrate of the same material as the substrate 3, such that the peripheral part of the substrate 3 contacts the inside edge of the dummy substrate.

FIG. 18 shows a modification of the substrate-supporting unit illustrated in FIG. 2. Generally, in a vapor-phase deposition apparatus, the peripheral part of a substrate 3, which contacts an annular substrate-supporting member 10, is likely to be cooled due to the thermal resistance at the interface between the substrate 3 and the member 10. The substrate-supporting unit shown in FIG. 18 is designed to prevent the peripheral part from being cooled. More specifically, an annular wall 10f is formed integrally with a holder 4, protrude upwards therefrom, and is located right below the inside edge of the annular member 10. The inside edge of the member 10 is therefore heated more than any other part of the member 10, because of the heat radiated from the top of the annular wall 10f. It follows that the peripheral part of the substrate 3, which is placed on the inside edge of the member 10, is heated to the same temperature as any other part of the substrate 3. As a result, the substrate 10 has a surface-temperature distribution which is sufficiently uniform.

FIG. 19 shows a second modification of the substrate-supporting unit illustrated in FIG. 2. This modification is also designed to prevent the peripheral part from being cooled. An annular wall 10g is integrally formed with a substrate-supporting member 10, and protrudes downwards from the inside edge of the member 10. The inside edge of the member 10 is heated more than any other part of the member 10, because of the heat radiated from the holder 4 is readily applied to the lower end of the annular wall 10g. Hence, the peripheral part of the substrate 3, which is placed on the inside edge of the member 10, is heated to the same temperature as any other part of the substrate 3. As a result, the substrate 10 has a surface-temperature distribution which is sufficiently uniform.

The inventors made several substrate-supporting units of the types shown in FIGS. 18 and 19, which had annular walls 10f and 10g having various heights H1, and used them in a vapor-phase deposition apparatus available to the inventors, thus heating substrates. Then, they recorded the temperatures to which the walls 10f and 10g were heated, against the heights of these annular walls. The results were as is shown in the graph of FIG. 20, which is graph representing the relation between the total-slip length L of a substrate (plotted on the Y axis) and the difference $\Delta T$ (plotted on the x axis) between the temperature (T1) of the substrate and the temperature (T2) of the annular wall 10f or 10g.

Figure 20:
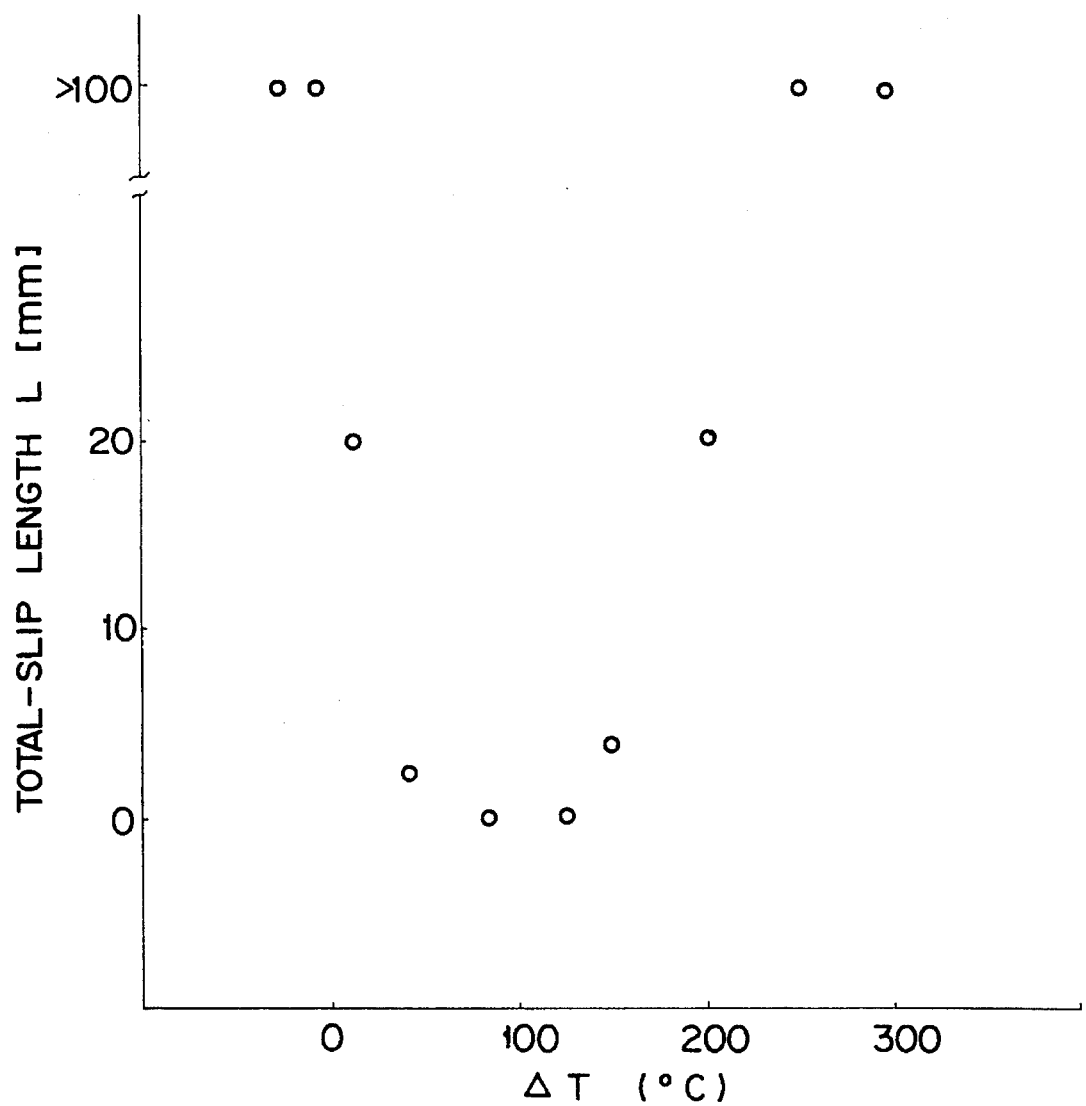
FIG. 20 is a graph representing the relation between the total-slip length L of a substrate and the temperature difference $\Delta T$ between the substrate and a portion of the supporting member, said relation being one observed in the modifications illustrated in FIGS. 18 and 19.

As is evident from FIG. 20, when the temperature difference $\Delta T$ is less than 10° C., the slip is enormous. This is because the peripheral part of the substrate 3 is less heated than the other part due to the thermal resistance at the interface between the substrate 3 and the member 10, and the substrate 3 inevitably has a non-uniform temperature distribution.

As is evident from FIG. 20, too, the slip is also prominent when the difference $\Delta T$ is greater than 200° C. This is because the peripheral part of the substrate 3 is excessively heated and more than the other part, despite of the thermal resistance at the interface between the substrate 3 and the member 10, and the substrate 3 inevitably has a non-uniform temperature distribution.

As can be understood from FIG. 20, the slip can be minimized by heating the annular wall 10f or 10g to a temperature 10° to 200° C. higher than that of the substrate 3, thereby imparting a more uniform temperature distribution to the substrate 3.

There are two methods of heating the inner edge of the member 10 to a temperature 10° to 200° C. higher than that of the substrate 3. The first method is to control the temperatures of the center and peripheral parts of the holder 4 independently. The second method is set the distance H1 (FIGS. 18 and 19) between the annular wall 10f or 10g and the member 10 or the holder 4, at a specific ratio to the distance H2 (FIGS. 18 and 19) between the holder 4 and the substrate 3.

The first method can be performed by means of the heating unit illustrated in FIG. 21. The heating unit comprises two heater coils 6a and 6b, two power supplies 8a and 8b connected to the coils 6a and 6b, respectively, and two temperature controllers 9a and 9b connected to the power supplies 8a and 8b, respectively. The controllers 9a and 9b have a radiation thermometer each. The thermometers incorporated in the controllers 9a and 9b detect the temperatures ambient to the center and peripheral parts of the substrate 3, respectively. The controllers 9a and 9b controls the power supplies 8a and 8b and, hence, the heater coils 6a and 6b, in accordance with the temperatures thus detected, such that the substrate 3 has a uniform surface-temperature distribution.

When the spaces between heater coils 6a and 6b are located corresponding to outermost portions of the substrate 3, as is shown in FIG. 21, the substrate-supporting member 10 can be controlled to a desired temperature, thereby enabling the substrate 3 to have a uniform temperature distribution. The arrangement of the coils 6a and 6b is not limited to this. If each of them is further divided, and the number of spaces between the coils 6a and 6b and between divided portions of each coil is more than two, at least one of the spaces must be located corresponding to outermost portions of the substrate 3 to obtain the same effect.

Other types of heating units can be employed to perform the first method of heating the annular wall 10f or 10g to a temperature 10° to 200° C. higher than that of the substrate 3. For example, thermocouples can be used, instead of thermometers, for directly detecting the temperature of that portion of the member 10 which contacts the substrate 3, thus measuring the temperature of the peripheral part of the substrate 3. Further, four or more heater coils can be used, instead of three, thereby to heat the substrate more uniformly. Still further, only one heater coil can be used, which consists of portions, each having turns arranged at a different pitch and exhibiting a different heat-generating efficiency.

The second method of heating the annular wall 10f or 10g to a temperature 10° to 200° C. higher than that of the substrate 3 will now be explained in detail. To determine the most desirable ratio of the distance H2 between the holder 4 and the member 10 to the distance H1 of the annular wall 10f or 10g and the member 10 or the holder 4, the inventors studied the the relation between the total-slip length L of a substrate and the ratio, H2/H1, which was observed in the substrate-supporting units of the types shown in FIGS. 18 and 19 they have made for experimental use. This relation was as is shown in the graph of FIG. 22, wherein the ratio H2/H1 is plotted on the X axis, and the total-slip length L is plotted on the Y axis.

Figure 22:
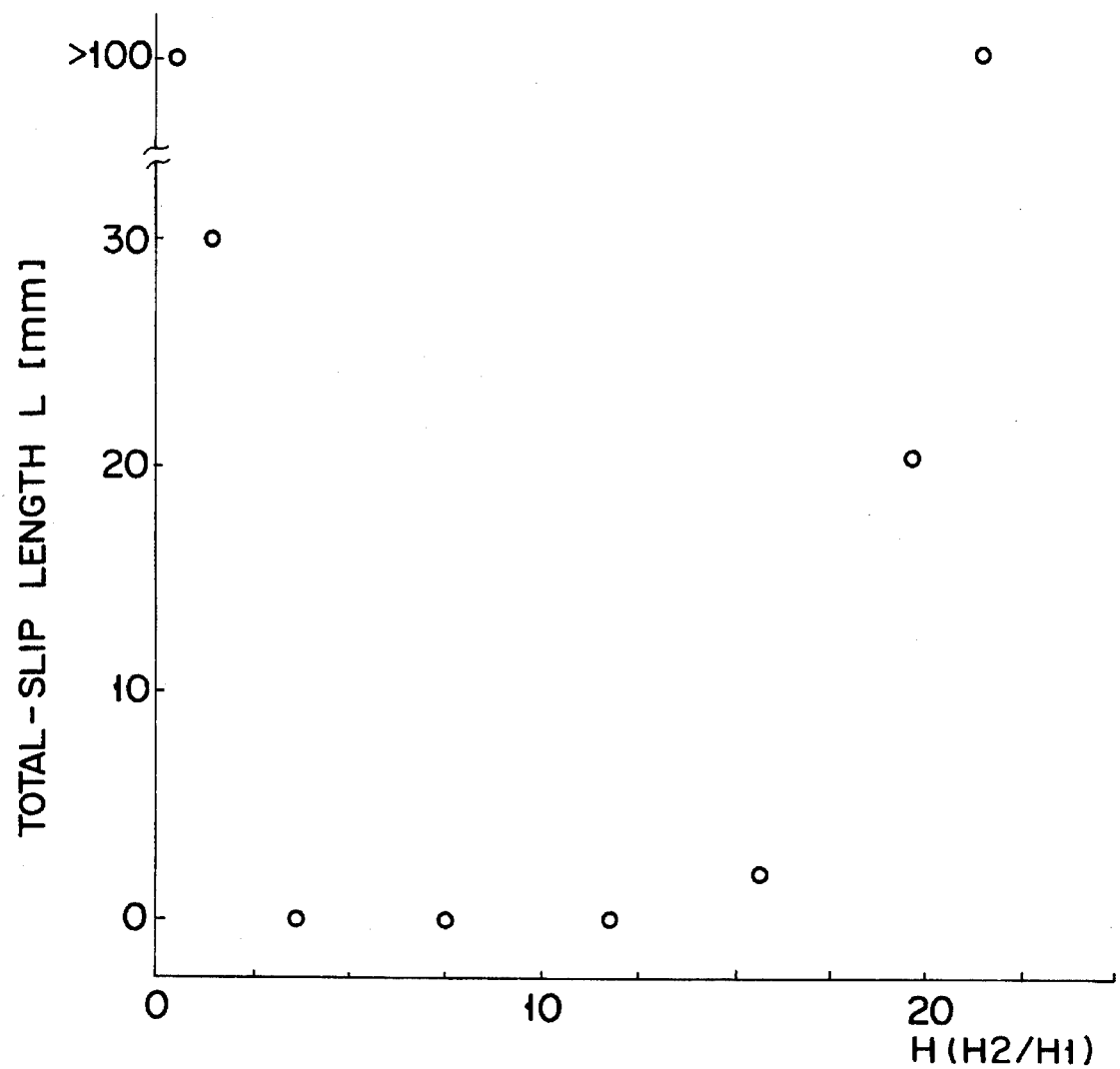
FIG. 22 is a graph showing the relation between the total-slip length L of a substrate and H2/H1, observed in the modifications illustrated in FIGS. 18 and 19, where H1 is the distance between the substrate holder and the substrate-supporting member, and H2 is the distance between the substrate and the substrate holder.

As can be understood from FIG. 22, the slip in the substrate 3 is enormous when the ratio H2/H1 is less than 2. This is because the peripheral part of the substrate 3 is less heated than the other part due to the thermal resistance at the interface between the substrate 3 and the member 10, and the substrate 3 inevitably has a non-uniform temperature distribution. Further, as is evident from FIG. 22, the slip is great also when the ratio H2/H1 is greater than 20. This is because the peripheral part of the substrate 3 is heated excessively and more than the other part, despite of the thermal resistance at the interface between the substrate 3 and the member 10, and the substrate 3 inevitably has a non-uniform temperature distribution.

Hence, as can be understood from FIG. 22, the slip in the substrate 3 can be reduced to a minimum, by setting the ratio H2/H1 to a value ranging from 2 to 20, thereby to impart a uniform surface-temperature distribution to the substrate 3.

Although not shown in the drawings, the substrate-supporting unit of FIG. 19 can be modified such that the annular wall 10g is more thick, extending over almost the entire lower surface of the substrate-supporting member 10.

As has been described, due to the thermal resistance at the interface between the substrate 3 and the member 10, the peripheral part of the substrate 3 may be less heated than the other part, and the substrate 3 may inevitably has a non-uniform temperature distribution. In this case, the substrate-supporting member 10, which is a thin member, also has a non-uniform temperature distribution and, hence, a thermal stress. Due to this thermal stress, the member 10, which is thin, warps, inevitably changing the distance between the substrate 3 and the holder 4 changes, and the surface-temperature distribution of the substrate 3 becomes even less uniform.

FIG. 23 shows another type of a substrate-supporting unit according to the invention, which is designed to prevent the member 10 from warping in spite of the thermal stress. More specifically, this unit has an annular rib 10h integrally formed with the substrate-supporting member 10 and extending downward from the peripheral edge thereof. The rib 10h mechanically reinforce the substrate-supporting member 10, thus preventing the member 10 from warping.

FIG. 24 illustrates another type of a substrate-supporting unit, designed also to prevent the member 10 from warping in spite of the thermal stress. As is shown in FIG. 24, the member 10 consists of two parts 10 which are made of the same material. Thus, the member 10, as a whole, is less likely to warp due to the thermal stress. In addition, owing to the thermal resistance at the joint between the parts 10j and 10k, the temperature fall at the peripheral part of the substrate 3, which contacts the member 10, can be decreased.

FIG. 25 shows another substrate-supporting unit according to the present invention. This unit comprises a holder 4 and a substrate-supporting member 10 located above the holder 4. The member 10 is a disc and has a center hole 10a which has a shape similar to that of the substrate 3 and has a diameter slightly less than that of the substrate 3. The substrate 3 is supported by the member 10, with its peripheral part contacting the member 10. There are no gaps between the substrate 3 and the member 10, thus not allowing the feed gas flow into the space between the holder 4 and the lower surface of the substrate 3. Hence, no layer will be deposited on the lower surface of the substrate 3.

A fourth embodiment of the invention will be described, with reference to FIGS. 26, 27 and 28. This embodiment is characterized by the use of a substrate-supporting unit having a substrate-supporting member which is made of material having low thermal conductivity, such as glass or ceramics.

FIG. 26 illustrates a substrate-supporting unit for use in the vapor-phase deposition apparatus according to the fourth embodiment. This unit comprises a holder 4 and a substrate-supporting member 10 formed on the holder 4. The member 10 is a disc made of glass or ceramics and having a center hole 10a. The hole 10a has a diameter slightly less than that of the substrate 3. A stepped portion is formed at the inner edge of the member 10. Hence, the substrate 3 is supported on the member 10, with its peripheral part resting on the stepped portion. Since the member 10 is made of glass or ceramics, either being material having low thermal conductivity, a minimum amount of heat is applied from the holder 4 to the peripheral part of the substrate 3 through the substrate-supporting member 10.

FIG. 27 shows a first modification of the unit shown in FIG. 26. This modification is identical to the unit of FIG. 26, except that an annular thin wall 10c with a pointed top is integrally formed on the stepped portion of the substrate-supporting member 10. Hence, the substrate 3 is set in line-contact with the substrate-supporting member 10. This reduces the cross-sectional area of the heat path extending from the holder 4 to the peripheral part of the substrate 3. Therefore, the heat distribution in the substrate 3 is more uniform than in the case where the substrate 3 is supported by the unit illustrated in FIG. 26.

FIG. 28 is a plan view illustrating a second modification of the substrate-supporting member shown in FIG. 26. This modification comprises three blocks 10 made of glass or ceramics, instead of one ring-shaped member 10 shown in FIG. 26. Obviously, the total cross-sectional area of these blocks 10 is far smaller than that of the single member 10 (FIG. 26), and the heat distribution in the substrate 3 is more uniform than when the substrate 3 is supported by the unit of FIG. 26.

A fifth embodiment of the invention will now be described, with reference to FIGS. 29, 30A and 30B. The fifth embodiment is characterized by the measures taken to heat a substrate 3 uniformly even if the substrate warps.

The results of the experiments repeated by the inventors show that substrates warp at a curvature ranging from about 10 mR to about 100 mR, depending on the temperature to which the substrates are heated and also the emissibility which the substrates have. The fifth embodiment of the invention is designed based on this finding.

FIG. 29 shows a substrate holder 4 for use in the vapor-phase deposition apparatus according to the fifth embodiment of the invention. As is evident from FIG. 29, the holder 4 has a circular recess 20 having a concave bottom. The concave bottom has a curvature within a range from about 10 mR to about 100 mR. Hence, when the substrate 3 placed on the holder 4 warps at a curvature falling in the same range, the gap between the substrate 3 and the bottom of the recess 20 is uniform. As a result of this, the same amount of heat is applied from the bottom of the recess 20 to any part of the substrate, whereby the substrate 3 has a uniform surface-temperature distribution, all the time a crystal layer is formed on the substrate 3 by means of vapor-phase deposition.

FIGS. 30A and 30B illustrate another type of a substrate holder 4 for use in the vapor-phase deposition apparatus according to the fifth embodiment. This holder 4 has a circular recess 20 having a flat bottom. It also has a vertical through hole 4d made in the bottom of the recess 20, and a horizontal through hole 4e opening at the periphery of the recess 20. The hole 4d is connected by a pipe 18 to a second gas-supplying unit 19. Gas, such as $N_2$, which has lower thermal conductivity than the carrier gas is supplied from the unit 19 into the recess 20 through the vertical hole 4d. (Note: The thermal conductivity of $N_2$ is about ten times lower than that of the carrier gas such as $H_2$.) The gas thus introduced into the recess 20 can be exhausted therefrom through the horizontal through hole 4e. The substrate holder 4 is made of carbon, and has a high heat-emissibility.

Since the gas filled in the recess 20 has low thermal conductivity, it scarcely conducts heat to the substrate 3 from the bottom of the recess 20. Hence, the heat radiated from the bottom of the recess 20 predominantly heats the substrate. Even if the substrate 3 warps as is shown in FIG. 30B, the amount of heat radiated to a part of the substrate 3 is almost the same as that of heat radiated to any other part of the substrate 3, regardless of the distance between the substrate 3 and the bottom of the recess 20. Therefore, the substrate 3 has a uniform surface-temperature distribution.

The advantage of using the substrate-supporting unit of FIGS. 30A and 30B can also be well understood from the graph of FIG. 2, which reveals that the temperature of the substrate 3 greatly changes with the distance D when the distance D between the substrate 3 and the holder 4 is equal to or less than 1 mm, but changes very little when the distance D is greater than 1 mm, owing to the gas scarcely conducting heat to the substrate 3 from the holder 4.

FIG. 31 shows a modification of the substrate holder illustrated in FIGS. 30A and 30B. This modification is identical to the holder of FIGS. 30A and 30B, except that there are no horizontal through holes. The gas supplied from the second gas-supplying unit 19 into the recess 20 through the pipe 18 is purged from the recess 20 through the gap between the peripheral part of the substrate 3 and the stepped portion of the substrate holder 4.

No matter in which holder, the one shown in FIGS. 30A and 30B or the one shown in FIG. 31, the gas supplied into the recess 20 cannot only be $N_2$, but also an inert gas (e.g., argon, xenon or helium), $CF_4$, $CO_2$, or halogen gas. Whichever one of these gases is used, the same advantage will be obtained.

Moreover, in the holder shown in FIGS. 30A and 30B or the holder shown in FIG. 31, the carrier gas or the gas having lower thermal conductivity can be supplied into the recess 20 through the hole 4d or 4c and then purged through the horizontal hole 4e or through the gap between the peripheral part of the substrate 3 and the stepped portion of the holder 4. In this case, the feed gas cannot flow into the recess 20 through said gap, to alter the amount of heat applied to the substrate 3 from the holder 4 or to form a crystal layer on the lower surface of the substrate 3.

FIGS. 32 to 34 illustrate the modifications of the substrate holders illustrated in FIGS. 29, 30A, 30B, and 31. These modified substrate holders are identical to those of FIGS. 29, 30A, 30B, and 31, except that the recess 20 horizontally extends into the peripheral portion of the holder 4 and, therefore, has a greater diameter than the substrate 3. Since the heat path formed of the peripheral portion of the holder 4 has a smaller cross-sectional area, the substrate 3 will have a surface-temperature distribution more uniform than in the case where it is supported by the holders illustrated in FIGS. 29, 30A, 30B, and 31.

A sixth embodiment of the invention will now be described, with reference to FIGS. 35 and 36. The vapor-phase deposition apparatus according to the fifth embodiment is characterized in that no supports protrude from the holder 4, for supporting the substrate-supporting member 10. More specifically, as is shown in FIG. 35, the member 10 is held horizontally within the reaction vessel 2 by means of a support 13 which horizontally extends from the inner periphery of the vessel 2.

Figure 35:
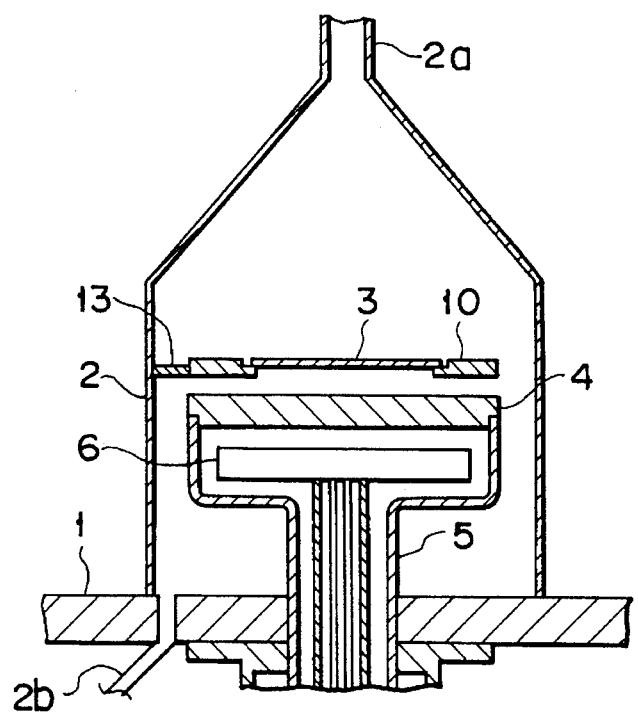
FIG. 35 is a vertical sectional view illustrating a vapor-phase deposition apparatus according to a sixth embodiment of the invention.
Figure 36:
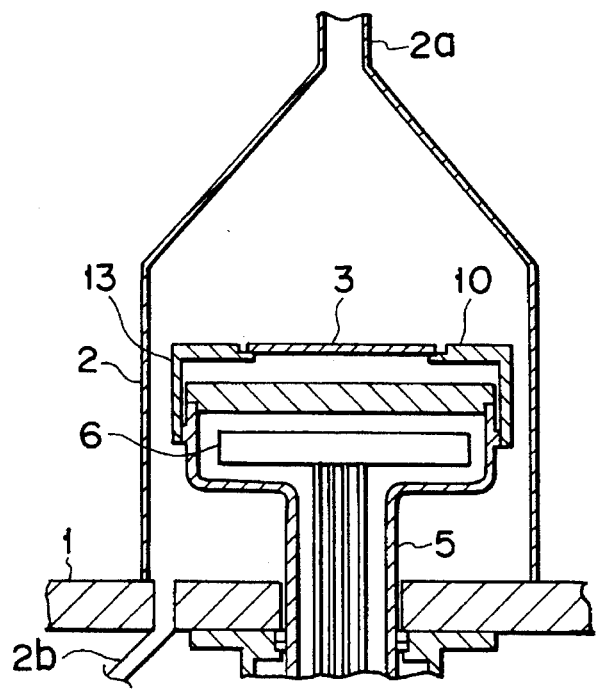
FIG. 36 is a vertical sectional view showing a modification of the sixth embodiment of the invention.

FIG. 36 illustrates a modification of the vapor-phase deposition apparatus shown in FIG. 35. The modified apparatus is identical to the apparatus of FIG. 35, except that the substrate-supporting member 10 is supported by a support 13 which is secured to a rotatable, vertical hollow cylinder 5. Alternatively, the member 10 can be supported by a support (not shown) which protrude upwards from a base plate 1.

In the vapor-phase deposition apparatus of FIG. 35 or FIG. 36, no heat is conducted to the substrate 3 directly from the substrate holder 4. This helps to heat the substrate 3 uniformly; the peripheral part of the substrate 3 is heated to the same temperature as any other part.

Figure 37:
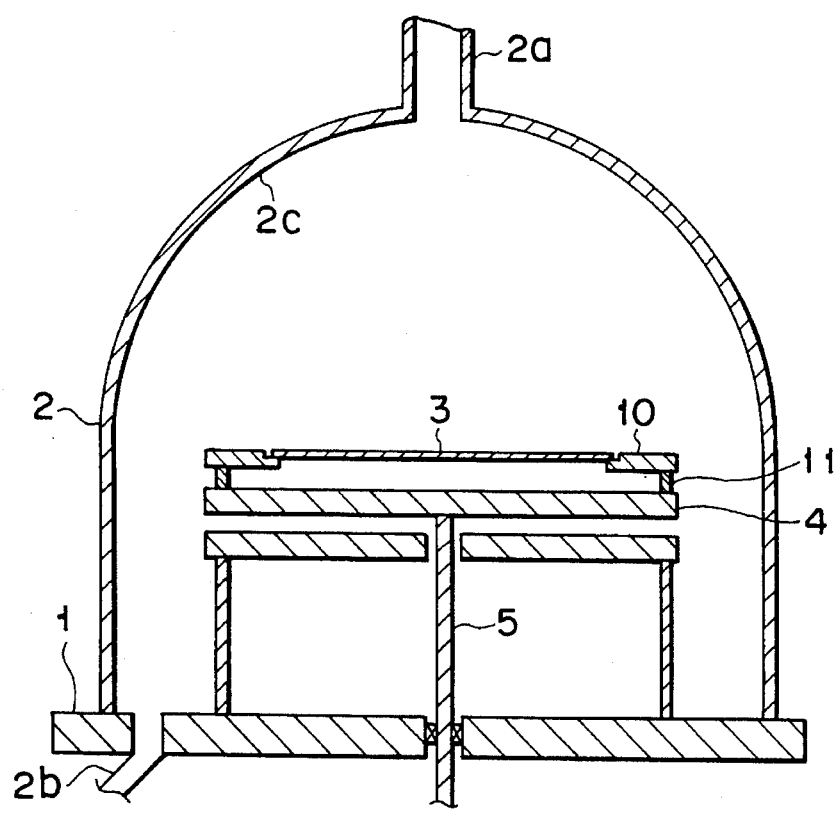
FIG. 37 is a cross-sectional view schematically showing a modified reaction vessel.

FIG. 37 shows a modified reaction vessel 2 for a component of the vapor-phase deposition apparatus according to this invention. This vessel 2 is characterized in that its inner surface 2a is polished to a degree close to mirror-polish degree, thus having a small roughness. The inner surface 2a, therefore, has a low heat-emissibility. Due to the low heat-emissibility, the substrate 3 can have a uniform surface-temperature distribution.

Alternatively, the reaction vessel 2 can be made of material which has a low heat-emissibility, or the inner surface 2a of the vessel 2 can be coated with a layer of material having a low heat-emissibility. In either case, the substrate 3 can have a uniform surface-temperature distribution.

All embodiments described above are vapor-phase deposition apparatuses of the type, in which only one substrate 3 is supported within the so-called vertical reaction vessel 2. Nevertheless, the present invention can be applied to any other type of a vapor-deposition apparatus. vapor-phase deposition apparatuses of other types, according to the invention, will now be described with reference to FIGS. 38 to 42.

Figure 38:
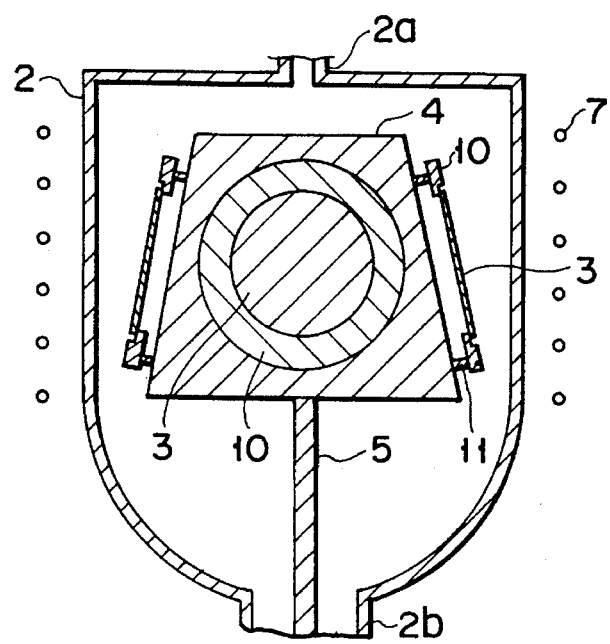

FIG. 38 illustrates a so-called "barrel-type" vapor-phase deposition apparatus according to the invention. This apparatus is characterized by the use of a substrate holder 4 which is a truncated pyramid. Four sets of support posts 11 are provided on the four sides of the holder 4, respectively; the posts 11 of each set protrude from one side of the substrate holder 4. Four substrate-supporting members 10 are supported by the four sets of posts 11, respectively, and located above the four sides of the holder 4, respectively. Hence, four substrates 3 can be simultaneously processed within a reaction vessel 2.

FIG. 39 illustrates a so-called horizontal vapor-deposition apparatus according to the invention. The feed gas and the carrier gas are supplied into a reaction vessel 2 through a gas-inlet port 2a, and flow through the vessel horizontally to the right (FIG. 39).

FIG. 40 shows a modification of the substrate-supporting member 10 incorporated in the horizontal vapor-phase deposition apparatus illustrated in FIG. 39. The modified member 10 is designed to support a plurality of substrates 3.

FIGS. 41 and 42 are schematic views of a vapor-phase deposition apparatus according to the invention, and explain how to transfer a substrate into, and out of, the reaction vessel 2 of the apparatus. As is shown in FIGS. 40 and 41, a substrate holder 4 is connected to the upper end of a shaft 5. Mounted on the holder 4 is a substrate-supporting member 10 which supports a substrate 3. The shaft 5 extends downwards through bellows 30 secured to the lower end of the vessel 2 in airtight fashion. The shaft 5 is coupled, at its lower end, to a drive unit 31. The drive unit 31 moves the shaft 5 up and down.

A chamber 33 is located beside the reaction vessel 2 and connected thereto by means of a gate valve 32. A substrate tray 34 is provided in the chamber 33. The tray 34 is connected by a connection rod 36 to a tray-transferring unit 37. The unit 37 moves the rod 36 back and forth, in the directions of arrows A. Hence, the substrate tray 34 is horizontally moved, back and forth through the chamber 33, and into and out of the reaction vessel 2 through the gate valve 32.

In operation, the member 10 supporting a substrate 3 is placed on the substrate tray 34. Then, the tray-transferring unit 37 is operated, thereby transferring the tray 34 into the reaction vessel 2 through the gate valve 32. Next, the member 10 is moved from the tray 34 onto the holder 4 which has been lowered to the bottom of the reaction vessel 2. Then, the unit 37 is operated, transferring the tray 34, now empty, from the vessel 2 to the chamber 33 through the gate valve 32. Thereafter, the drive unit 31 is operated, thus moving the shaft 5 upwards, and so moving the substrate holder 4. As a result of this, the substrate-supporting member 10 is moved up to a predetermined level within the reaction vessel 2, and the substrate 3 is subjected to vapor-phase deposition. Upon completion of the deposition, the drive unit 31 is operated, lowering the shaft 5. Hence, the holder 4, the member 10, and the substrate 3 are moved downwards altogether. The tray-transferring unit 37 is operated, transferring the tray 34 into the reaction vessel 2 through the gate valve 32. The member 10 is moved from the holder 4 onto the tray 34. The unit 37 is further operated, thus transferring the tray 34, now supporting the member 10 and, hence, the processed substrate 3, from the vessel 2 into the chamber 33 through the gate valve 32.

The chamber 33 has an opening made in the top, which is closed by a cover 39. An O-ring 38 is interposed between the cover 39 and the top of the chamber 33. The chamber 33 has an exhaust port 33a made in the bottom. Through this port 33, the unreacted gas is discharged from the chamber 33 in a controlled amount, whereby the pressure in the chamber 33 is adjusted to the best possible value.

In the vapor-phase deposition apparatus shown in FIGS. 41 and 42, the substrate 3 can be transferred into and out of the reaction vessel 2, while supported by the member 10. In other words, the substrate 3 need not be mounted onto or removed from the member 10. This helps to enhance the efficiency of vapor-phase deposition.

The present invention is not limited to the embodiments and modifications—all described above. Needless to say, various changes and other modifications can be made, without departing from the spirit and scope of the present invention.

What is claimed is:

1. A vapor-phase deposition apparatus comprising:

an annular substrate-supporting member having a supporting portion which holds a peripheral part of a substrate;

a plate-shaped substrate holder for holding said substrate-supporting member, said plate-shaped substrate holder being disposed opposite to said substrate;

heating means for heating said plate-shaped substrate holder; and protrusions protruding from one of said substrate-supporting member and said substrate holder so that a distance between said substrate holder and said supporting portion of said substrate-supporting member is not more than a distance between said substrate holder and a portion of said substrate-supporting member other than said supporting portion;

wherein, by maintaining said supporting portion of said substrate-supporting member at a higher temperature than said portion of said substrate-supporting member other than said supporting portion by means of said protrusions, a surface temperature distribution is uniform in said substrate.

2. The vapor-phase deposition apparatus according to claim 1, wherein said protrusions have a height determined such that a rate (H2/H1) of a distance (H1) between said substrate holder and said supporting portion of said substrate-supporting member to a distance (H2) between said substrate holder and said substrate is set within a range of 2 to 20.

3. The vapor-phase deposition apparatus according to claim 1, wherein said protrusions are set at a temperature which is 10° to 200° C. higher than that of said substrate.

4. The apparatus according to claim 1, further comprising temperature-controlling means for controlling a temperature of said supporting portion which holds the peripheral part of the substrate, independently of a temperature of the substrate.

5. The apparatus according to claim 1, further comprising heating means having divided portions, wherein at least one space between the divided portions is located to correspond to an outermost portion of the substrate.

* * * * *